US 6,689,215 B2

(12) United States Patent
Nguyen

(10) Patent No.: US 6,689,215 B2
(45) Date of Patent: Feb. 10, 2004

(54) METHOD AND APPARATUS FOR MITIGATING CROSS-CONTAMINATION BETWEEN LIQUID DISPENSING JETS IN CLOSE PROXIMITY TO A SURFACE

(75) Inventor: Andrew Nguyen, Santa Clara, CA (US)

(73) Assignee: ASML Holdings, N.V., Veldhoven (NL)

( * ) Notice: Subject to any disclaimer, the term of this patent is extended or adjusted under 35 U.S.C. 154(b) by 0 days.

(21) Appl. No.: 10/265,203

(22) Filed: Oct. 3, 2002

(65) Prior Publication Data

US 2003/0102385 A1 Jun. 5, 2003

Related U.S. Application Data

(60) Continuation-in-part of application No. 09/800,060, filed on Mar. 5, 2001, which is a division of application No. 09/221,060, filed on Dec. 28, 1998, now Pat. No. 6,248,171.
(60) Provisional application No. 60/327,055, filed on Oct. 3, 2001, and provisional application No. 60/100,738, filed on Sep. 17, 1998.

(51) Int. Cl.$^7$ .............................. B05C 5/00; B05B 4/03; B05B 7/08; B05B 1/00; H01L 21/30
(52) U.S. Cl. ..................... 118/313; 118/315; 118/321; 234/549; 234/556; 234/566; 438/758; 438/780
(58) Field of Search ..................... 118/52, 500, 313, 118/315, 321, 25; 239/424.5, 549, 556, 566; 438/758, 778, 780

(56) References Cited

U.S. PATENT DOCUMENTS

| | | | | |
|---|---|---|---|---|
| 2,295,522 A | | 9/1942 | Shorter | 239/549 |
| 2,501,724 A | * | 3/1950 | Hughey | 239/549 |
| 2,501,725 A | | 3/1950 | Knopp | 239/549 |
| 3,204,682 A | * | 9/1965 | Teleshefsky et al. | 239/549 |

(List continued on next page.)

FOREIGN PATENT DOCUMENTS

| | | | | |
|---|---|---|---|---|
| EP | 0 110 558 A | | 6/1984 | G03F/7/26 |
| EP | 0794463 A2 | | 9/1997 | G03F/7/30 |

(List continued on next page.)

OTHER PUBLICATIONS

Zama Shigenori; Method for Developing Photoresist; Patent Abstracts of Japan; Publication No.: 09297403; Publication Date Jan. 18, 1997; Applicant: Nittetsu Semiconductor KK.

(List continued on next page.)

*Primary Examiner*—J. A. Lorengo
(74) *Attorney, Agent, or Firm*—Blakely, Sokoloff, Taylor & Zafman LLP

(57) ABSTRACT

Methods and apparatus for delivering a variety of processing fluids onto a semiconductor wafer substrate with a multi-port nozzle: The nozzle is formed with plurality of longitudinal liquid manifolds and gas manifolds. Each manifold is positioned within the nozzle body so they are in fluid communication with a separate corresponding inlet formed in the body of the nozzle. Fluid inlets may be connected to external sources for receiving processing fluids to be dispensed. In addition, the nozzle includes a plurality of nozzle tips for directing dispensed liquids onto the wafer substrate. At least some portion of each tip extends beyond the bottom surface of the nozzle, and at the same time, at least some portion of the tip extends into a liquid manifold within the nozzle body to form an interior reservoir. Furthermore, the bottom nozzle surface includes a network of trenches formed in between the nozzle tips in a grid-like pattern and may further include a plurality of gas orifices therein. The gas orifices are connected to a gas manifold to receive pressurized gas thereby forming gas curtains which assist in controlling and directing the various processing fluids onto the wafer substrate with reduced cross-contamination and splashback from the wafer substrate.

16 Claims, 21 Drawing Sheets

U.S. PATENT DOCUMENTS

| | | |
|---|---|---|
| 3,516,607 A | 6/1970 | Shelor |
| 4,326,553 A | 4/1982 | Hall .......................... 134/153 |
| 4,457,259 A | 7/1984 | Samuels ..................... 118/705 |
| 4,721,252 A | 1/1988 | Colton .................... 239/424.5 |
| 4,747,541 A | 5/1988 | Morine et al. .............. 118/313 |
| 4,872,417 A | 10/1989 | Kuwahara et al. ........... 118/313 |
| 4,938,994 A | 7/1990 | Choinski ..................... 427/96 |
| 5,094,884 A | 3/1992 | Hillman et al. ............. 427/240 |
| 5,127,984 A | 7/1992 | Hua et al. .................. 156/639 |
| 5,252,137 A * | 10/1993 | Tateyama et al. ............. 134/34 |
| D341,418 S | 11/1993 | Akimoto ................... D23/213 |
| 5,342,738 A | 8/1994 | Ikeda ........................ 430/325 |
| 5,374,312 A | 12/1994 | Hasebe et al. ................ 118/52 |
| 5,429,912 A | 7/1995 | Neoh ........................ 430/325 |
| 5,449,405 A | 9/1995 | Cardinali et al. ............. 118/50 |
| 5,625,433 A | 4/1997 | Inada et al. ................. 396/604 |
| 5,643,363 A | 7/1997 | Hosogaya et al. .......... 118/410 |
| 5,658,615 A | 8/1997 | Hasebe et al. ............. 427/240 |
| 5,678,116 A | 10/1997 | Sugimoto et al. ........... 396/611 |
| 5,685,934 A * | 11/1997 | Ikeda et al. ................. 118/302 |
| 5,720,814 A | 2/1998 | Takagi et al. ............... 118/319 |
| 5,769,946 A * | 6/1998 | Kutsuzawa et al. ......... 118/407 |
| 5,772,764 A | 6/1998 | Akimoto ..................... 118/319 |
| 5,782,978 A | 7/1998 | Kinose et al. .............. 118/321 |
| 5,788,773 A | 8/1998 | Okuda et al. ............... 118/319 |
| 5,814,151 A | 9/1998 | Lee et al. ................... 118/300 |
| 5,815,762 A | 9/1998 | Sakai et al. ................. 396/611 |
| 5,820,677 A | 10/1998 | Yonaha ..................... 118/680 |
| 5,824,155 A | 10/1998 | Ha et al. .................... 118/410 |
| 5,854,953 A * | 12/1998 | Semba ....................... 396/611 |
| 5,885,755 A | 3/1999 | Nakagawa et al. ......... 430/325 |
| 5,902,399 A | 5/1999 | Courtenay ................... 118/52 |
| 5,919,520 A | 7/1999 | Tateyama et al. ........... 427/240 |
| 5,939,139 A | 8/1999 | Fujimoto .................... 427/240 |
| 6,012,858 A | 1/2000 | Konishi et al. ............. 396/611 |
| 6,013,317 A | 1/2000 | Motoda et al. ............. 427/240 |
| 6,019,843 A | 2/2000 | Park et al. ..................... 118/52 |
| 6,033,475 A | 3/2000 | Hasebe et al. .............. 118/320 |
| 6,056,998 A | 5/2000 | Fujimoto .................... 427/240 |
| 6,062,240 A | 5/2000 | Sada et al. ................. 134/95.2 |
| 6,063,190 A | 5/2000 | Hasebe et al. ................ 118/52 |
| 6,159,662 A | 12/2000 | Chen et al. ................. 430/313 |
| 6,248,171 B1 | 6/2001 | Gurer et al. |
| 6,384,894 B2 * | 5/2002 | Matsuyama et al. .......... 355/27 |

FOREIGN PATENT DOCUMENTS

| | | | |
|---|---|---|---|
| EP | 0 829 767 A1 | 3/1998 | ............. G03F/7/16 |
| JP | 57198457 | 12/1982 | ............ G03C/5/24 |
| JP | 58111318 | 7/1983 | ............ H01L/21/30 |
| JP | 59007949 | 1/1984 | ............ G03C/5/24 |
| JP | 06045244 | 2/1994 | ......... H01L/21/027 |
| JP | 07282476 | 10/1995 | ............ G11B/7/26 |
| JP | 08142534 | 6/1996 | ............ B41N/3/28 |
| JP | 08272083 | 10/1996 | ............. G03F/7/00 |
| WO | WO 99/53381 | 10/1999 | ............. G03F/7/32 |
| WO | WO 00/16163 | 3/2000 | ............. G03F/7/30 |

OTHER PUBLICATIONS

Hagi Toshio; Method for Developing Photoresist; Patent Abstracts of Japan; Publication No.: 07142344; Publication Date Jun. 2, 1995; Applicant: Matsushita Electric Ind. Co. Ltd.

Miyamoto Koichi; Developing Device; Patent Abstracts of Japan; Publication No.: 58088749; Publication Date May 26, 1983; Applicant Hitachi Tokyo Electronics Co. Ltd.

Nishikata Eiji; Developing Method of Resist Film; Patent Abstracts of Japan; Publication No.: 59050440; Publication Date Mar. 23 1984; Applicant: Fujitsu, Ltd.

* cited by examiner

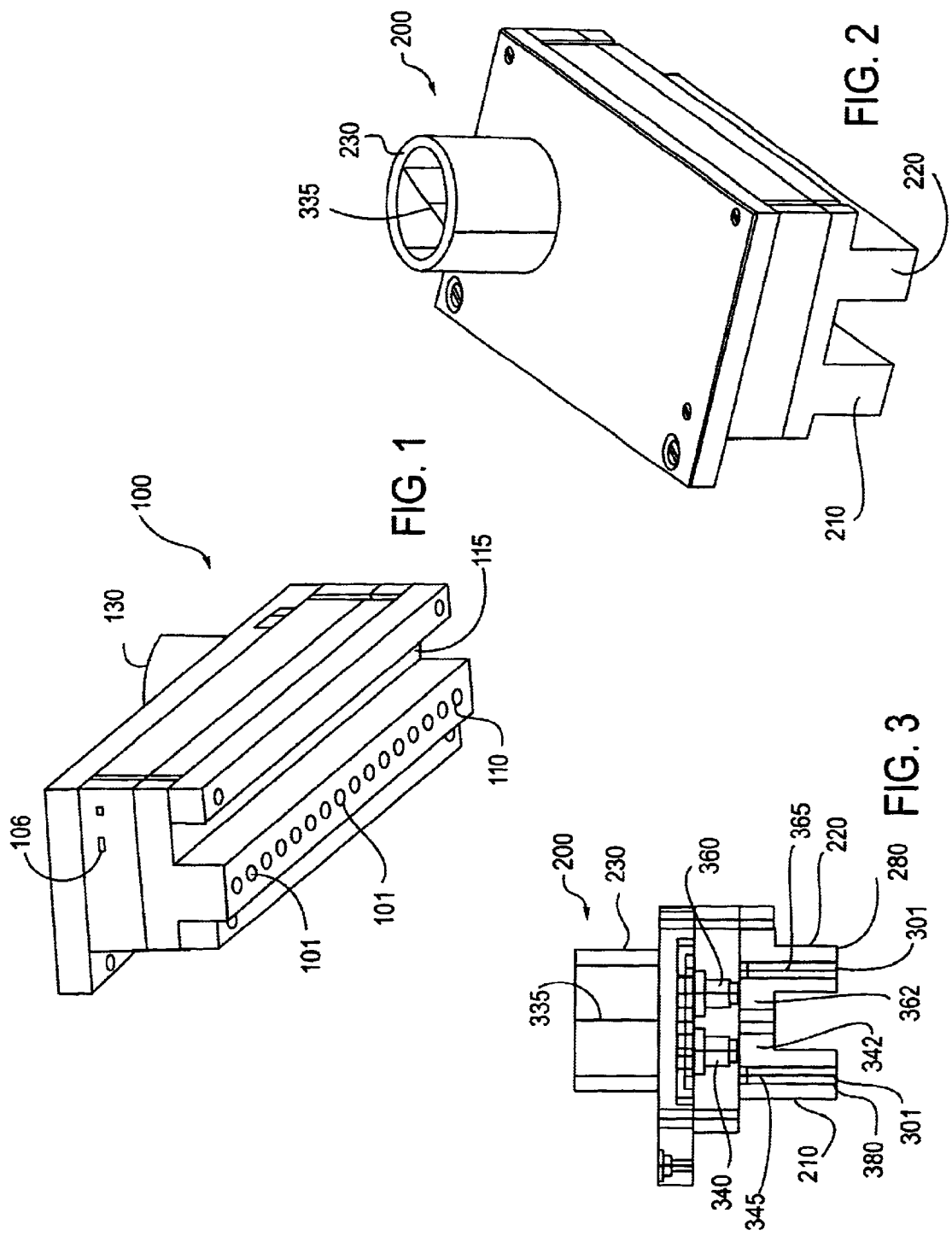

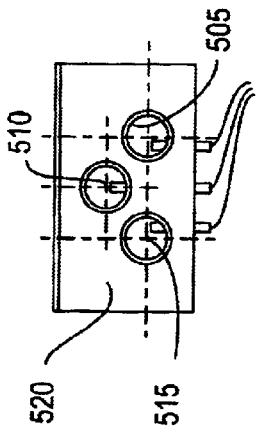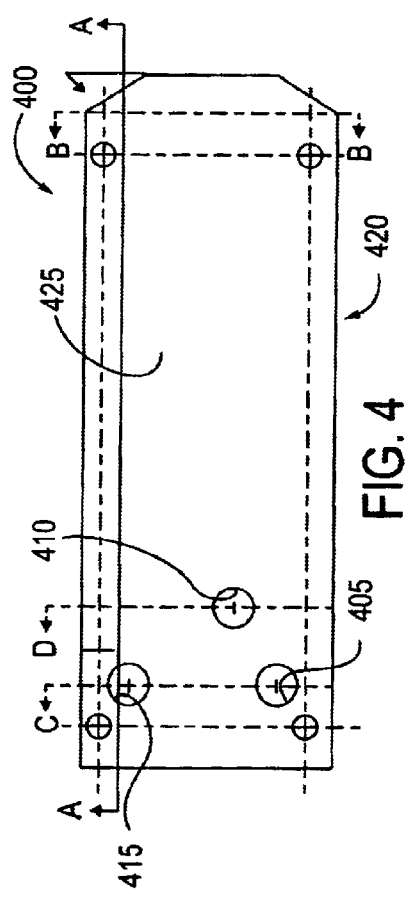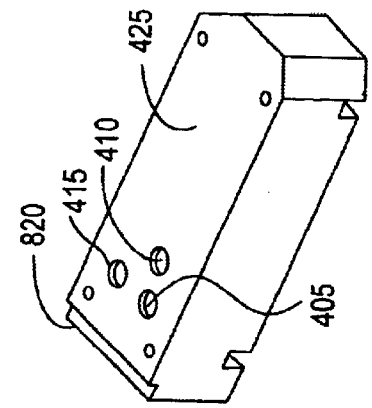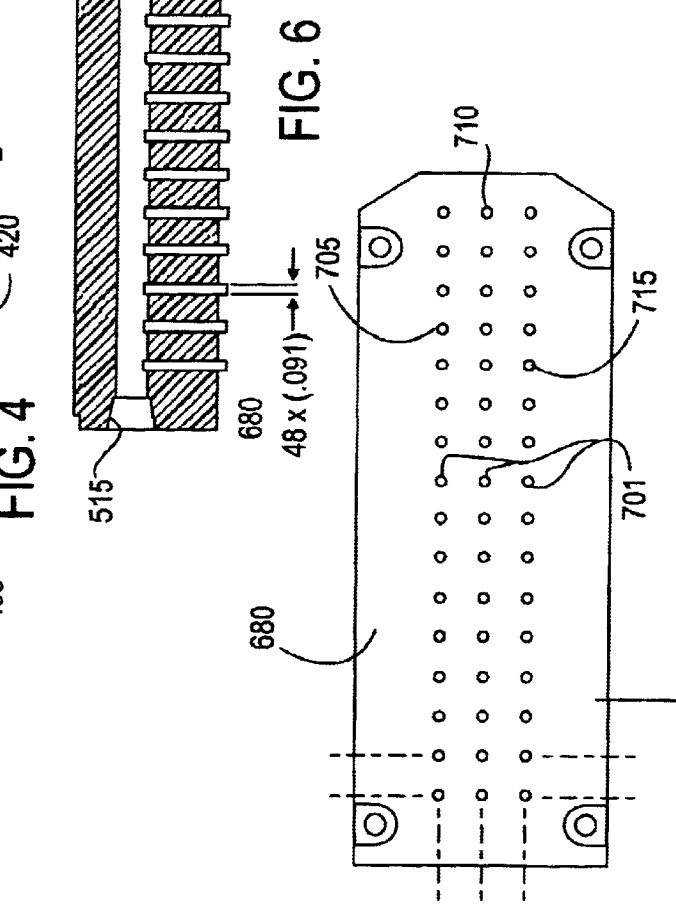

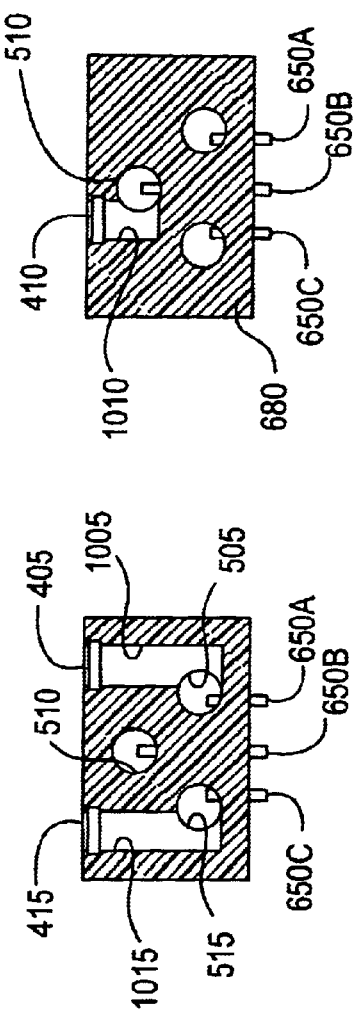
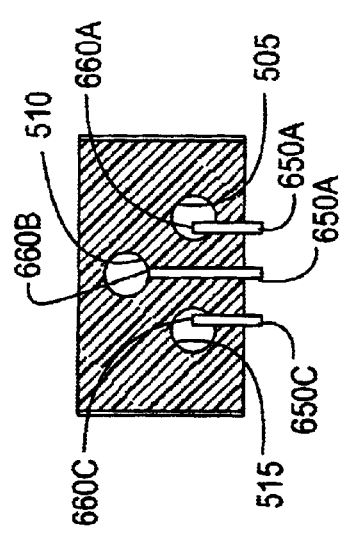
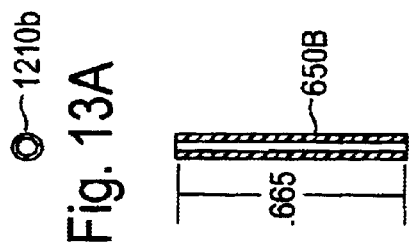
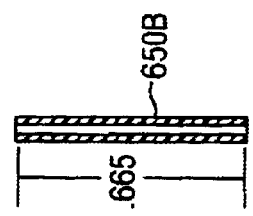
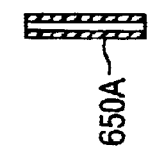
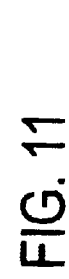

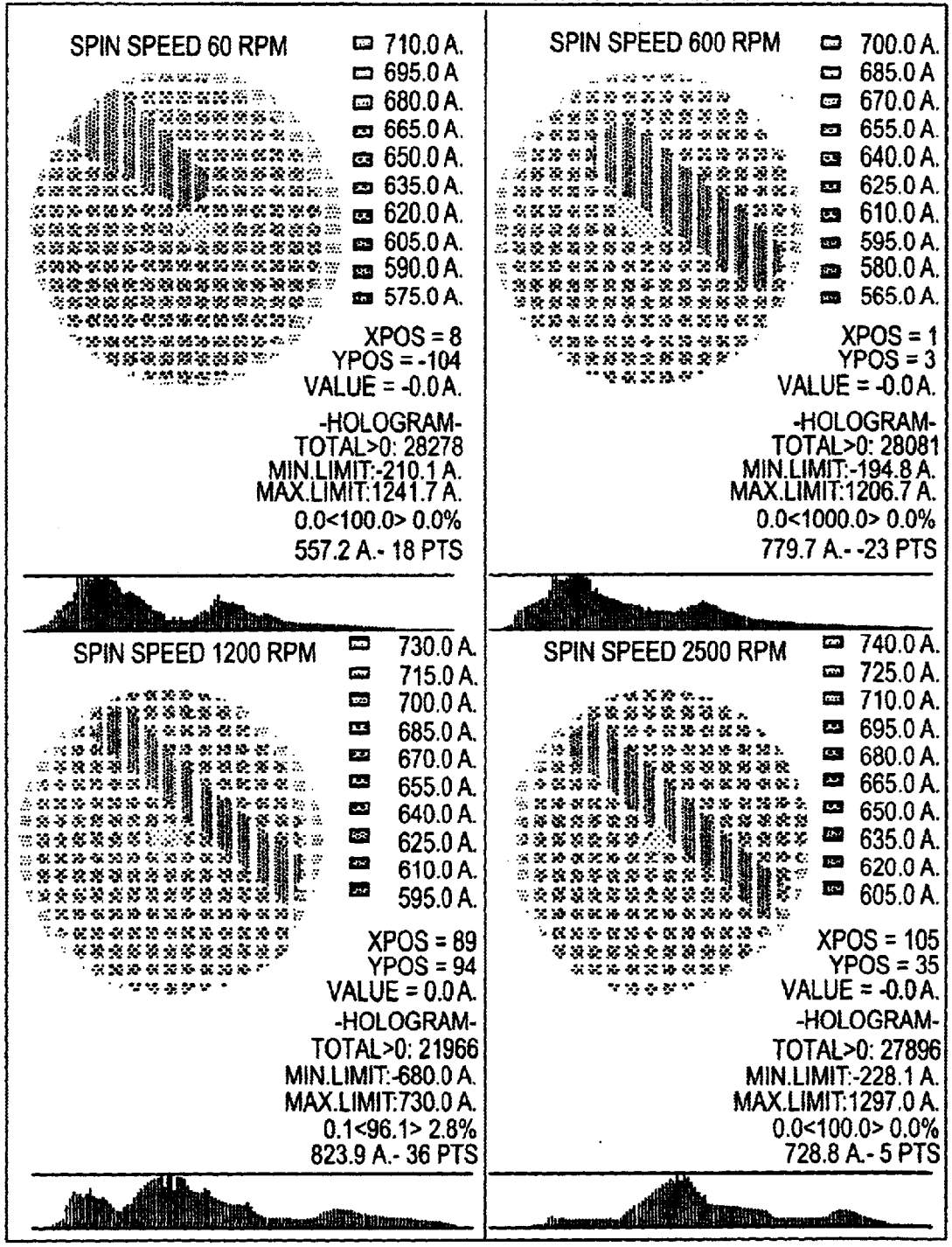

SECTION E-E

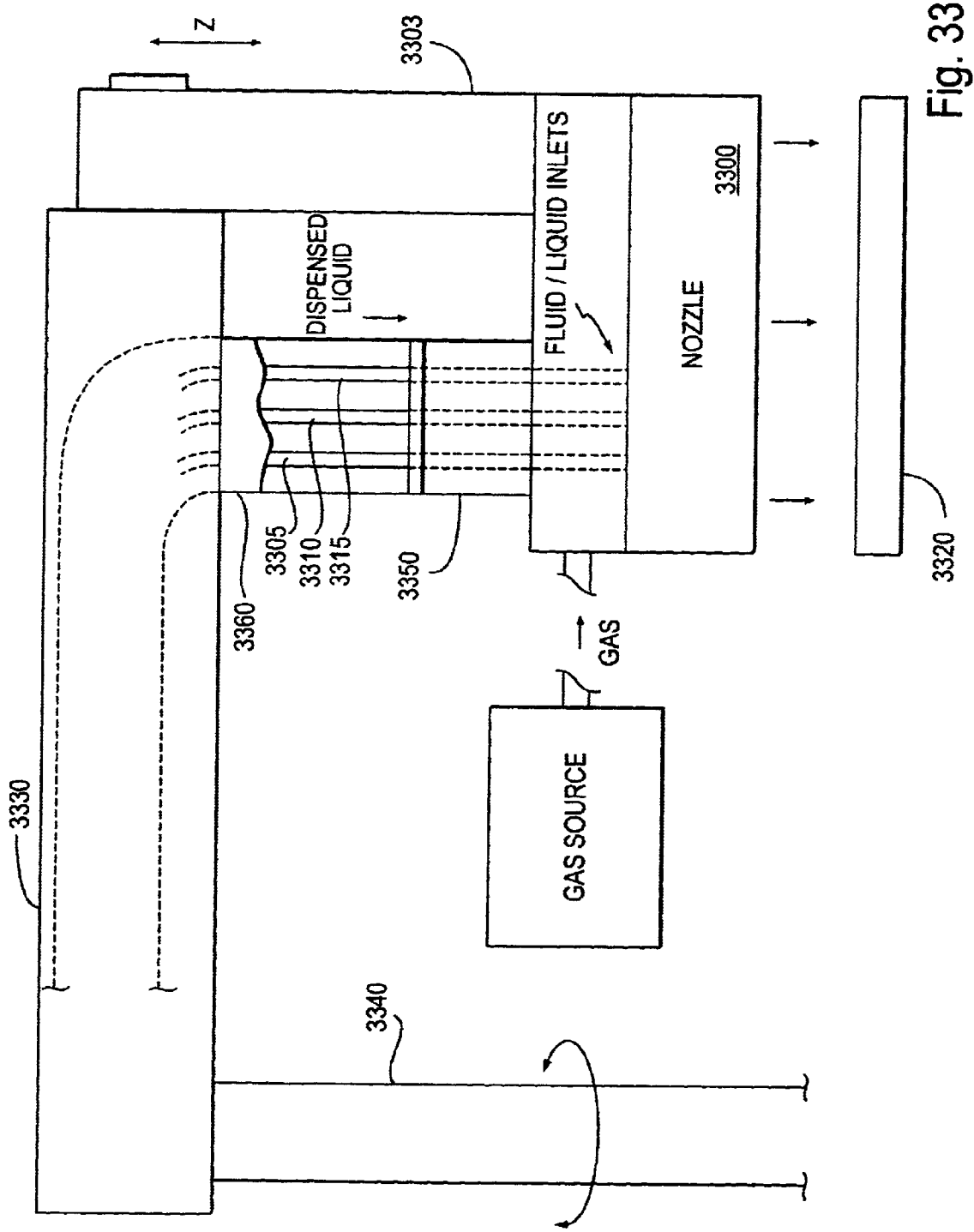

METHOD AND APPARATUS FOR MITIGATING CROSS-CONTAMINATION BETWEEN LIQUID DISPENSING JETS IN CLOSE PROXIMITY TO A SURFACE

CROSS-REFERENCE TO RELATED APPLICATIONS

This application claims the benefit of priority from U.S. provisional patent application Ser. No. 60/327,055 filed on Oct. 3, 2001, and is a continuation-in-part application of Ser. No. 09/800,060 filed on Mar. 5, 2001, which is a divisional application of Ser. No. 09/221,060 filed on Dec. 28, 1998 subsequently issuing as U.S. Pat. No. 6,248,171, which claimed the benefit of priority from U.S. provisional patent application Ser. No. 60/100,738 filed on Sep. 17, 1998, the entire contents of which are herein incorporated by reference in their entirety.

BACKGROUND OF THE INVENTION

1. Field of the Invention

The invention relates generally to the field of microelectronic fabrication. More particularly, the invention relates to methods and apparatus for improving the yield and line width performance of liquid polymers.

2. Discussion of the Related Art

Lithography process is one of the major drivers of semiconductor industry in its relentless progress in achieving smaller feature sizes with improved yields. More specifically, improved critical dimension (CD) control and reduced process-induced defect and particle counts need to be satisfied simultaneously.

The develop fluid module process plays a significant role in the patterning of increasingly smaller line widths. Regions of high and low dissolution rates are created on the resist film as a result of the sequence of photolithography process steps preceding the develop process. During a develop process, images transferred to the resists film are developed into three dimensional structures by a wet process. The subsequent etch process (mostly dry) transfers this image onto the substrate which may formed of Si, $SiO_2$, poly Si, etc.

There are many variations of a good develop process which generally consists of two main parts. In the first part, a developer fluid is dispensed over a wafer spinning at a low rpm followed by a static puddle formation and a long static or oscillating step at which regions of high dissolution rate are etched away to create three-dimensional images on the film. The quality of patterned images, the value of side wall angles, and the CD control, are all strongly affected by this first part of the develop process. In the second part of the develop process, a chemical wet etch step is immediately followed by a deionized (DI) water rinse step that is mainly intended to wash away dissolved resist and developer fluid mixture with minimum particle and defect count on the patterned wafer. The rinse step is thus an extremely crucial process in improving the resulting yield of a lithography process.

Heretofore, the requirements of improved critical dimension control, reduced process-induced defect counts and reduced process-induced particle counts referred to above have not been fully met. What is needed is a solution that simultaneously addresses all of these and other related requirements.

SUMMARY OF THE INVENTION

The invention provides methods and apparatus for the reduction of cross-contamination of dispensed liquids during the develop process in lithography systems. A primary goal of the invention is to improve yield resulting from lithography processes. Another primary goal of the invention is to offer improved critical dimension (CD) control capability. Solutions are thus provided for these and other related problems encountered in conventional developer fluid modules of a wafer track tool system. It shall be understood that the particular features of the described embodiments in the following specification may be considered individually or in combination with other variations and aspects of the invention.

A first aspect of the invention is implemented in an embodiment that is based on a method for minimizing precipitation of developing reactant by lowering a sudden change in pH, said method comprising: developing at least a portion of a polymer layer on a substrate with a charge of developer fluid; then permitting at least a portion of said charge of developer fluid to dwell on said polymer so as to controllably minimize a subsequent sudden change in pH; and then rinsing said polymer with a charge of another fluid.

A second aspect of the invention is implemented in an embodiment that is based on a method for minimizing precipitation of developing reactant by lowering a sudden change in pH, said method comprising: developing at least a portion of a polymer layer on a substrate with an initial charge of a developer fluid; then rinsing said polymer with an additional charge of said developer fluid so as to controllably minimize a subsequent sudden change in pH; and then rinsing said polymer with a charge of another fluid.

A third aspect of the invention is implemented in an embodiment that is based on a method for minimizing precipitation of developing reactant by lowering a sudden change in pH, said method comprising: developing at least a portion of a polymer layer on a substrate with a charge of developer fluid; then contacting said substrate with a charge of buffer, thereby mixing at least a portion of said developer fluid with at least a portion of said charge of buffer, so as to controllably minimize a subsequent sudden change in pH; and then rinsing said polymer with a charge of another fluid.

A fourth aspect of the invention is implemented in an embodiment that is based on an apparatus for minimizing fluid impingement force on a polymer layer to be developed on a substrate, thereby improving yield and line width control performance, said apparatus comprising: a nozzle including: a manifold adapted to supply a fluid; a plurality of fluid conduits coupled to said manifold; and a plurality of tubular inserts located within said plurality of fluid conduits.

A fifth aspect of the invention is implemented in an embodiment that is based on an apparatus for minimizing fluid impingement force on a polymer layer to be developed on a substrate, thereby improving yield and line width control performance, said apparatus comprising: a nozzle including: a developer manifold adapted to supply a developer fluid; a plurality of developer fluid orifices coupled to said developer manifold; a rinse manifold adapted to supply a rinse fluid; and a plurality of rinse fluid orifices coupled to said developer manifold, wherein said developer manifold and said rinse manifold are staggered to reduce an exterior width of said nozzle.

A sixth aspect of the invention is implemented in an embodiment that is based on an apparatus for minimizing fluid impingement force on a polymer layer to be developed on a substrate, thereby improving yield and line width control performance, said apparatus comprising: a nozzle including: a developer manifold adapted to supply a developer fluid; a plurality of developer fluid orifices coupled to said developer manifold; a rinse manifold adapted to supply a rinse fluid; a plurality of rinse fluid orifices coupled to said rinse manifold, and said plurality of rinse fluid orifices arranged to define at least one rinse fluid axis, wherein said nozzle is connected to a bracket adapted to raise and lower said nozzle with regard to said substrate and reposition said at least one rinse axis so as to be substantially coplanar with a normal to a center of said substrate.

Additional aspects of the invention include methods and apparatus for mitigating cross-contamination between liquid dispensing jets in close proximity to a surface.

Some of the benefits provided by the invention includes the reduction of defect density during the develop process of a liquid polymer used in a photolithography step by employing new multi-port delivery apparatus with multi-dispense nozzles. An important aspect of the multi-port delivery apparatus herein is their ability to reduce droplet impact. This apparatus allows for the significant reduction of the defect density due to its superior rinsing action. In addition, this multi-port nozzle system allows two or more different developer fluid chemistries (in addition to a rinse chemistry) to be supported without any or reduced cross-contamination. These systems for delivering both developer fluid and deionized water or other material can reduce the impact force of dispensed liquid(s) thus preventing pattern collapse which may otherwise cause significant yield management problems for applications calling for small feature sizes. Furthermore, the delivery systems herein may be incorporated into or reside in the developer fluid module of a wafer track system in which uniform laminar air flow field exists as a prerequisite. In this application, the invention can be classified as involving several concepts including: (1) a multi-port nozzle system which supports the dispense of two or more different developer fluid fluids without any crosstalk; (2) a second multi-port nozzle system of same or similar geometry which may be used for the dispense of another liquid such as deionized water during a rinse step; and (3) implementing either concepts (1) or (2) to support dispensing dual-chemistry developer fluid as well as satisfying the low impingement requirement throughout the overall develop process. The invention further includes reducing possible critical dimension (CD) variation which may be attributed to the developer fluid module by distributing the developer fluid over an exposed wafer uniformly. This improves the overall CD control capability of a wafer track system when such steps and apparatus as provided herein are incorporated into the developer fluid module of a wafer track system. The track system can be further coupled to a stepper and other conventional wafer processing modules or systems. It shall be understood that the term coupled as used herein may defined as connected as between multiple system components, although not necessarily directly, and not necessarily mechanically to each other.

Other goals and advantages of the invention will be better appreciated and understood when considered in conjunction with the following description and the accompanying drawings. While the following description may contain specific details describing particular embodiments of the invention, this should not be construed as limitations to the scope of the invention but rather as an exemplification of preferable embodiments. For each aspect of the invention, many variations are possible as suggested herein that are known to those of ordinary skill in the art. Many changes and modifications may be made within the scope of the invention without departing from the spirit thereof, and the invention includes all such modifications.

BRIEF DESCRIPTION OF THE DRAWINGS

A clear conception of the advantages and features constituting the invention, including the components and operation of model systems provided with the invention, will become more readily apparent by referring to the exemplary and therefore non-limiting embodiments illustrated in the accompanying drawings which form a part of this specification. It shall be understood that similar or like reference numerals and characters designate the same or like parts when they occur in more than one view or figure. It should be further noted that the features illustrated in the drawings are not necessarily drawn to scale.

FIG. 1 illustrates a bottom perspective view of a multi-port nozzle, representing an embodiment of the invention.

FIG. 2 illustrates a top perspective view of a multi-port nozzle, representing another embodiment of the invention.

FIG. 3 illustrates a sectional view of the multi-port nozzle shown in FIG. 2.

FIG. 4 illustrates a top view of a multi-port nozzle, representing yet another embodiment of the invention.

FIG. 5 illustrates an end view of the multi-port nozzle shown in FIG. 4.

FIG. 6 illustrates a sectional view of the multi-port nozzle show in FIG. 4 taken along a manifold formed within the nozzle, section line A—A.

FIG. 7 illustrates a bottom view of the multi-port nozzle shown in FIG. 4.

FIG. 8 illustrates a top perspective view of the multi-port nozzle shown in FIG. 4.

FIG. 9 illustrates a sectional view of the multi-port nozzle shown in FIG. 4 taken along section line B—B.

FIG. 10 illustrates a sectional view of the multi-port nozzle shown in FIG. 4 taken along section line C—C.

FIG. 11 illustrates a sectional view of the multi-port nozzle shown in FIG. 4 taken along section line D—D.

FIG. 12A illustrates an end view of a nozzle or tubular insert, representing an embodiment of the invention.

FIG. 12B illustrates a sectional view of the nozzle insert shown in FIG. 12A.

FIG. 13A illustrates an end view of another nozzle or tubular insert, representing another embodiment of the invention.

FIG. 13B illustrates a sectional view of the nozzle insert shown in FIG. 13A.

FIGS. 22A–22D illustrate develop rate as a function of spatial position on the substrate for a developer axis offset of 20 mm, representing an additional embodiment of the invention.

FIG. 33 is a simplified side view of a robot arm assembly that may selected for movement and support of the various nozzles provided herein.

DETAILED DESCRIPTION OF THE INVENTION

Figure 14:
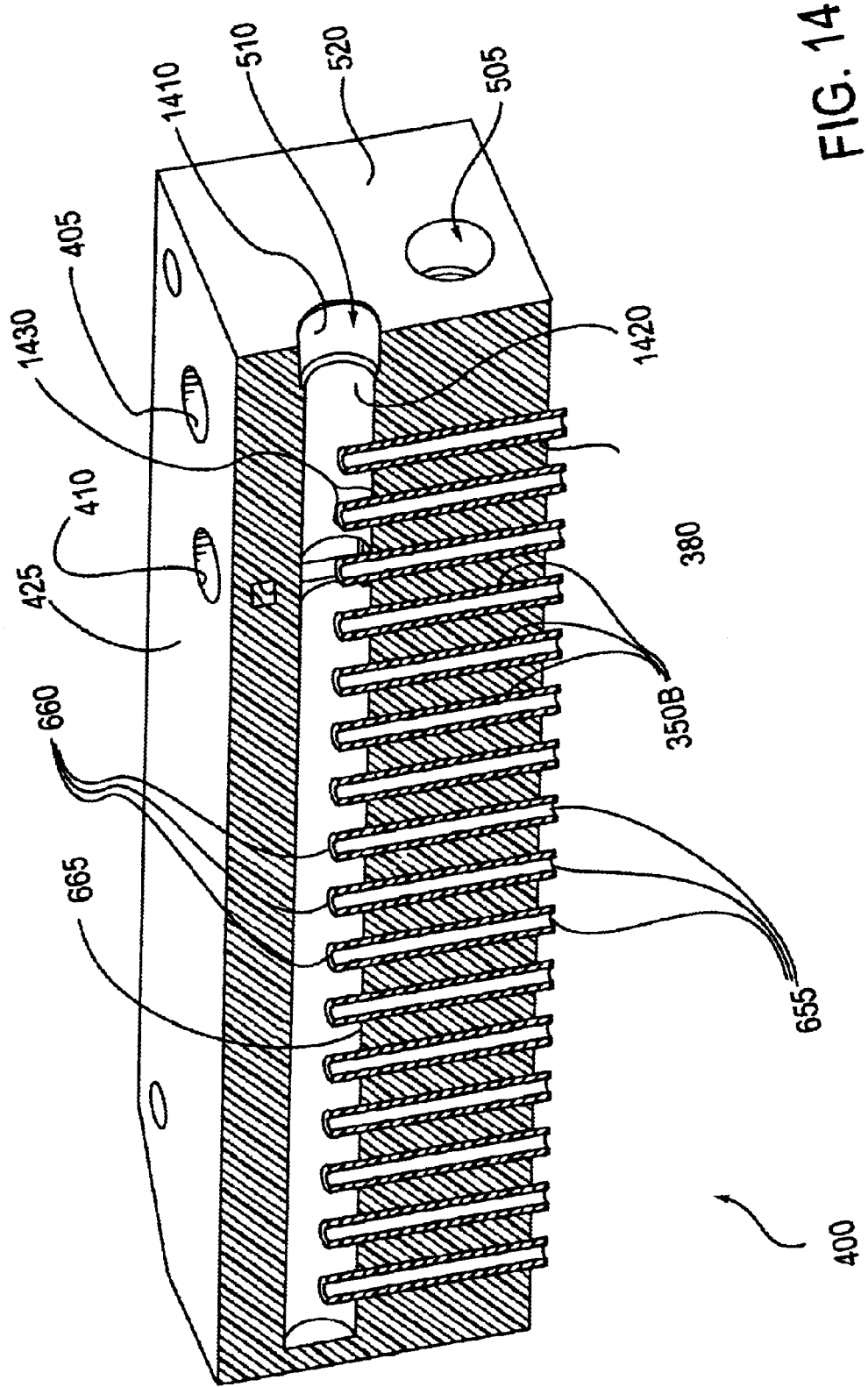
FIG. 14 illustrates a perspective sectional view of the multi-port nozzle shown in FIG. 4 taken along section line A—A.
Figure 15:
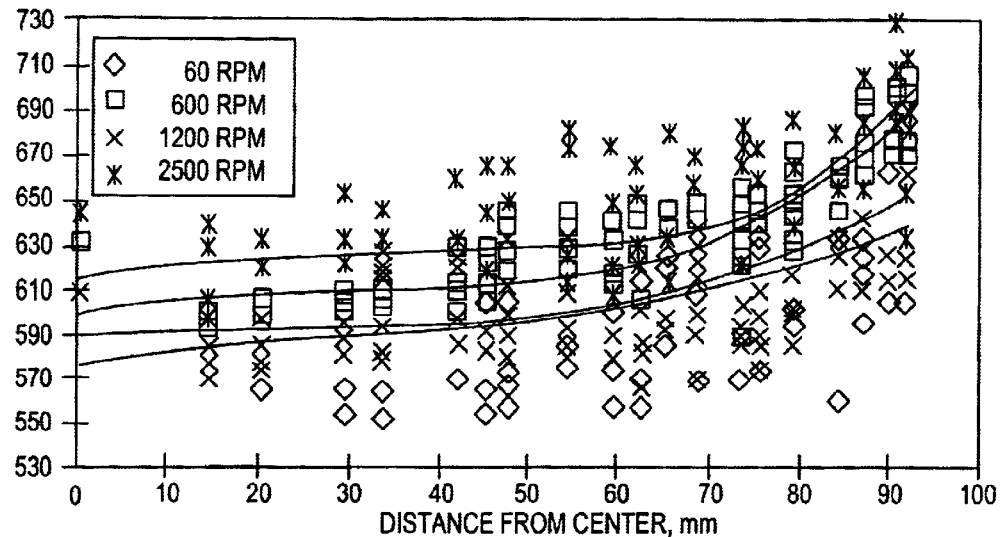
FIG. 15 illustrates develop rate as a function of the distance from the center of the substrate for a developer axis offset of 0 mm, representing an embodiment of the invention.
Figure 16:
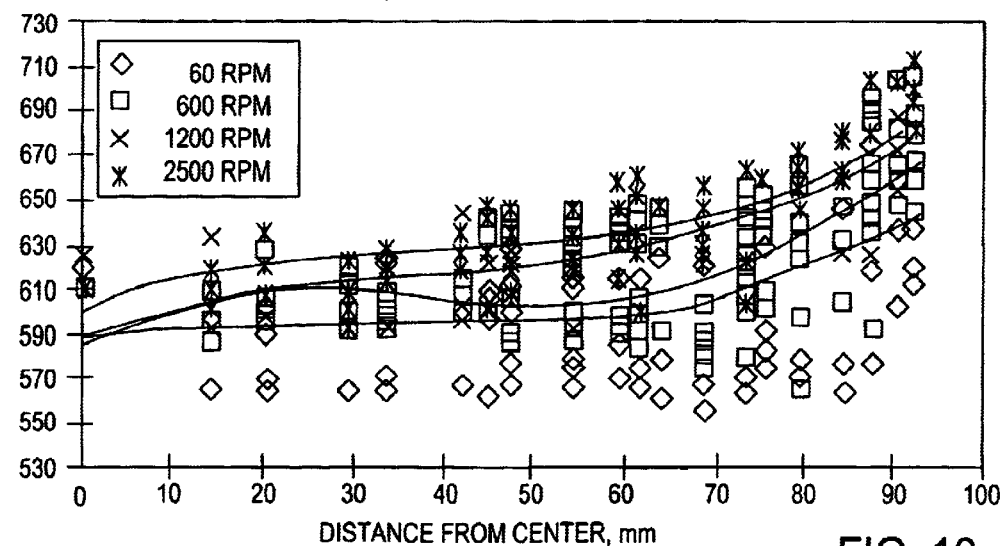
FIG. 16 illustrates develop rate as a function of the distance from the center of the substrate for a developer axis offset of 5 mm, representing another embodiment of the invention.
Figure 17:
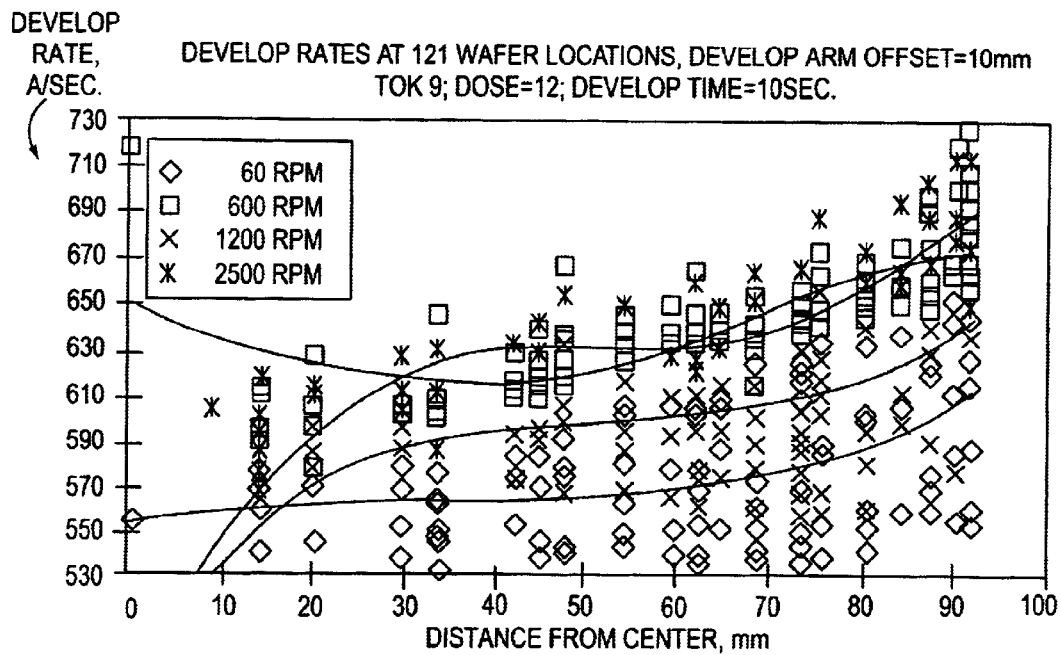
FIG. 17 illustrates develop rate as a function of the distance from the center of the substrate for a developer axis offset of 10 mm, representing yet another embodiment of the invention.
Figure 18:
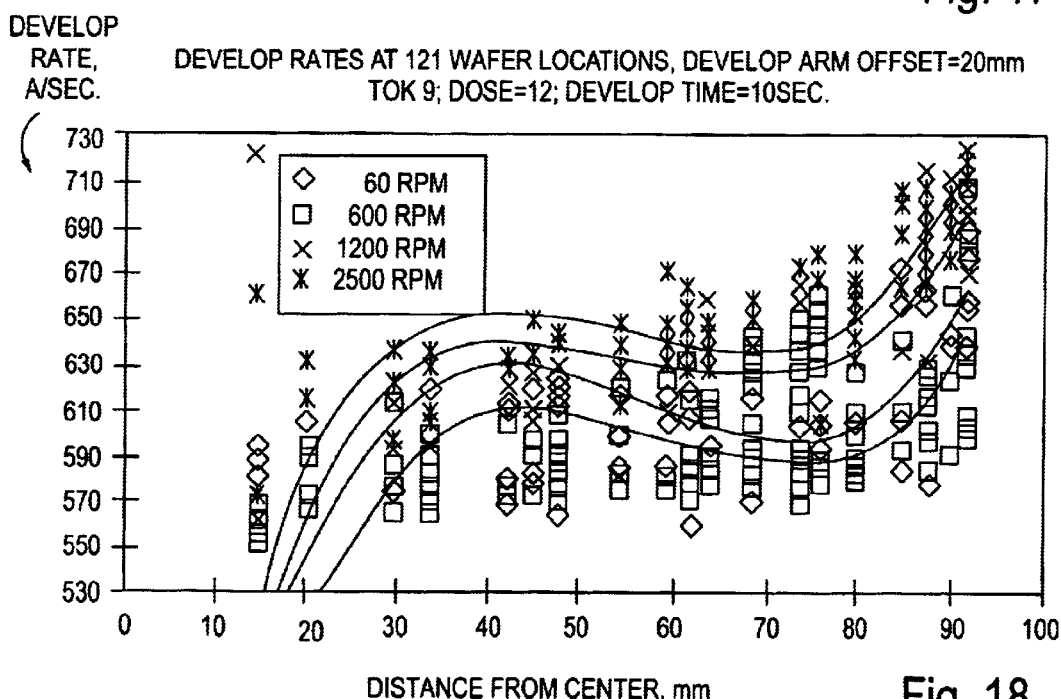
FIG. 18 illustrates develop rate as a function of the distance from the center of the substrate for a developer axis offset of 20 mm, representing an additional embodiment of the invention.
Figures 19A, 19B, 19C, 19D:
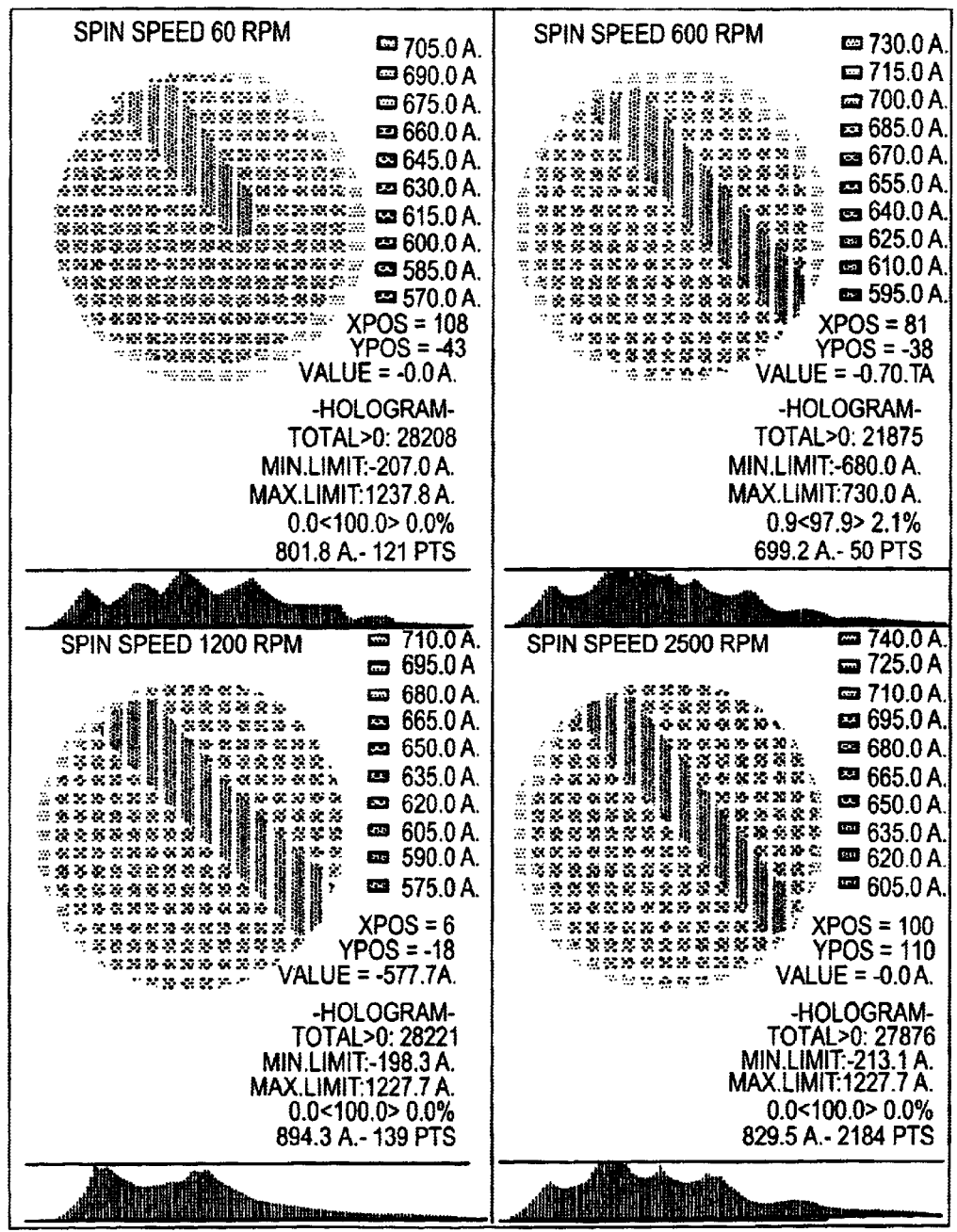
FIGS. 19A–19D illustrate develop rate as a function of spatial position on the substrate for a developer axis offset of 0 mm, representing an embodiment of the invention.
Figures 20A, 20B, 20C, 20D:
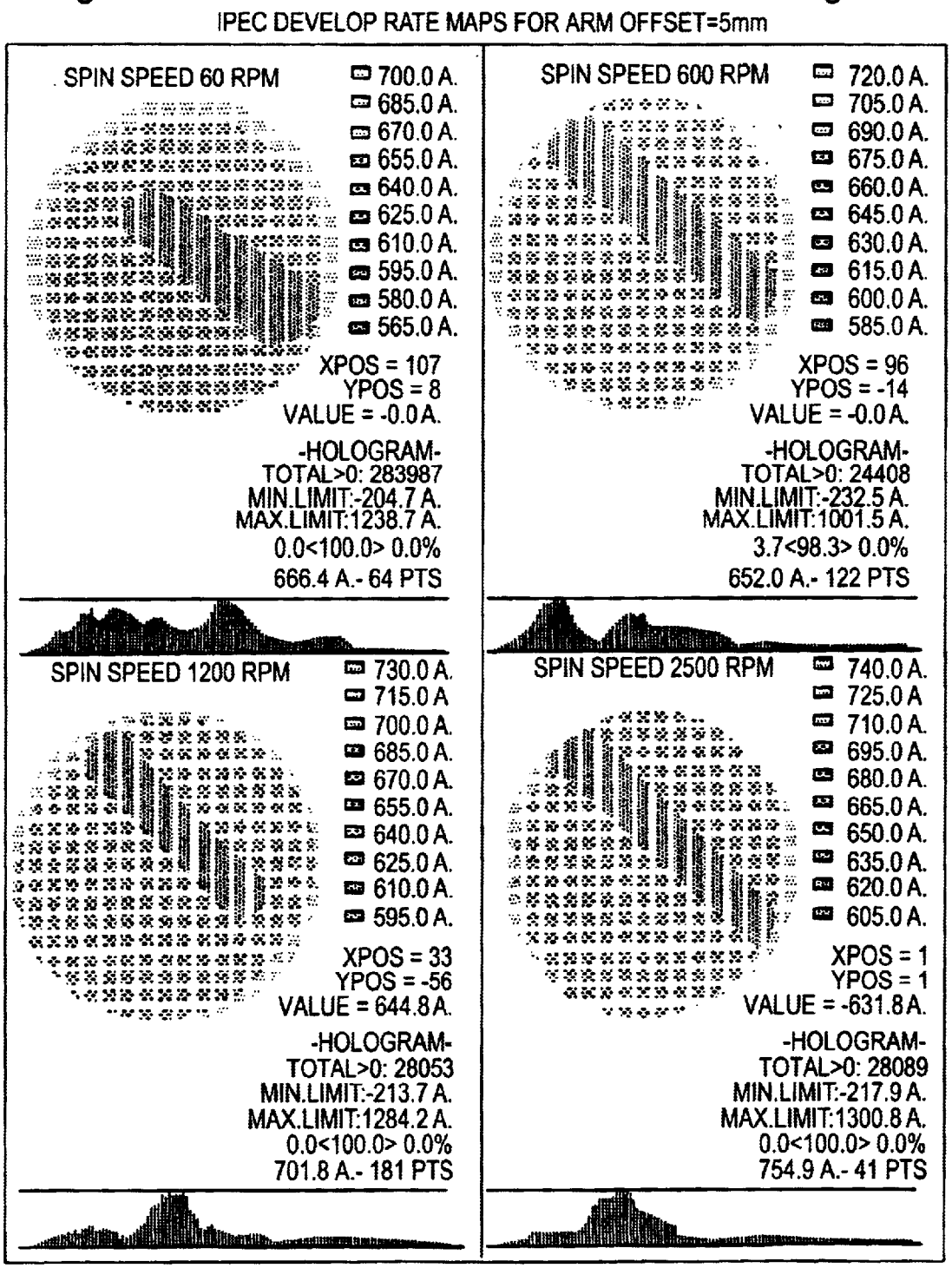
FIGS. 20A–20D illustrate develop rate as a function of spatial position on the substrate for a developer axis offset of 5 mm, representing another embodiment of the invention.
Figures 21A, 21B, 21C, 21D:
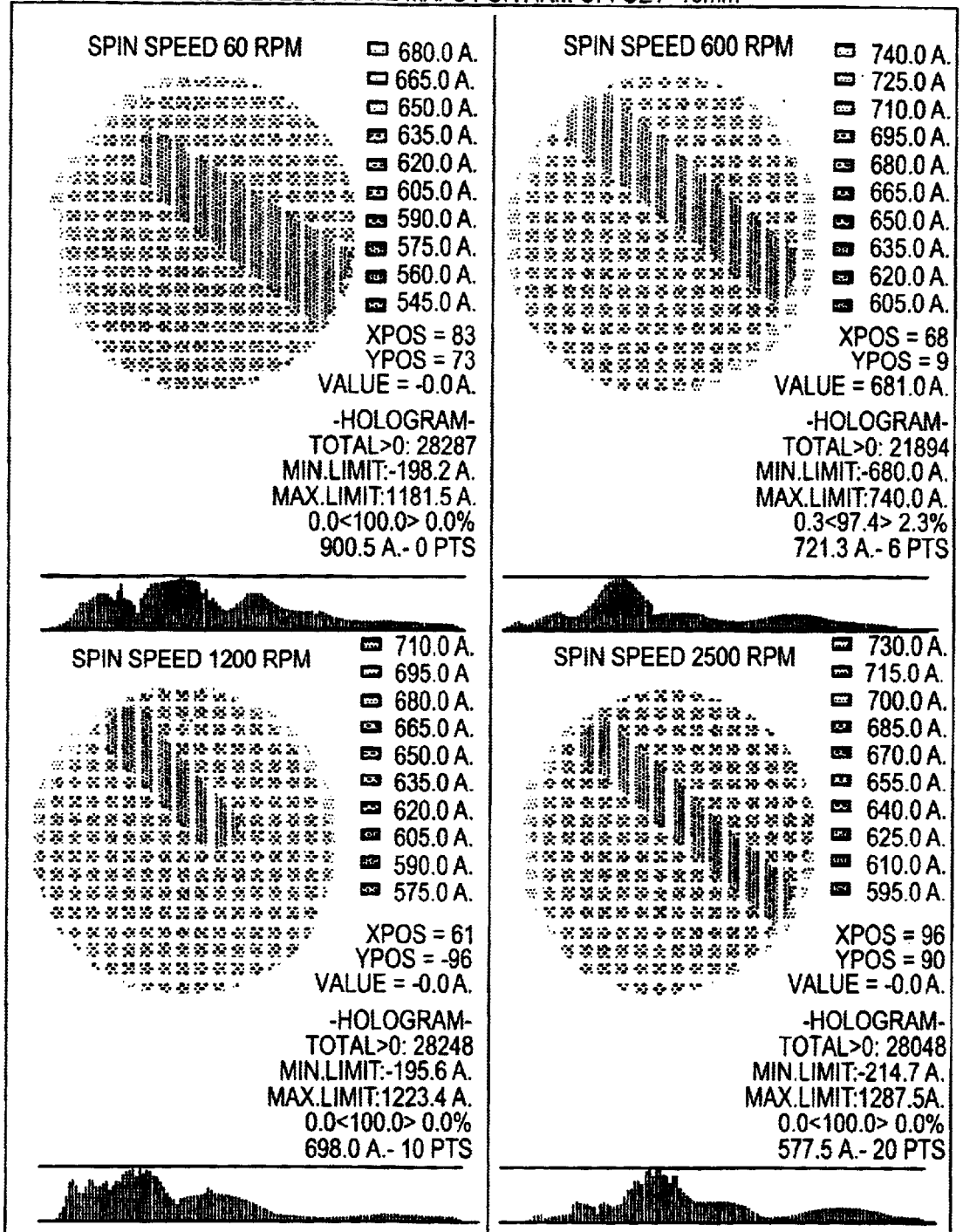
FIGS. 21A–21D illustrate develop rate as a function of spatial position on the substrate for a developer axis offset of 10 mm, representing yet another embodiment of the invention.

The various features and advantages of the invention are explained more fully below with reference to the illustrative embodiments shown in the accompanying drawings. It shall be understood that descriptions of well known components and processing techniques are omitted so as not to unnecessarily obscure the invention in detail.

FIG. 1 illustrates an embodiment of the invention that provides a liquid dispense nozzle 100 for dispensing a single chemistry fluid. The nozzle 100 may have a maximum width measured from a front face 105 to a back face equal to the radius of a semiconductor substrate wafer receiving the dispensed fluid. As with other variations of the invention described herein, the width and other relevant dimensions of the nozzle 100 may be modified for particular applications. The nozzle 100 may also include a main arm 110 having a plurality of conduits aligned along a vertical axis with respect to a bottom face 115 of the nozzle 100. An inlet manifold 130 receives an intake fluid, and the fluid is then distributed through the nozzle and onto a rotating wafer via a plurality of outlets 101. In this embodiment, the outlets 101 are shown to align linearly across the width of the main arm 110. The width of the nozzle 100 allows the dispensed fluid to cover the whole wafer in one full rotation of the wafer. As such, the nozzle 100 provides a uniform and fast distribution of the fluid, which for developing fluid applications is a crucial requirement for improved critical dimension (CD) control. It shall be understood that the context or fields of technology to which this and other embodiments of the invention may be applied includes the photolithography processing of micro-structures or microelectronic structures. These structures are typically etched and formed whereby deposited polymers of interest may function as masks to shield portions of the structures that are to remain at least largely unaffected by the etchant. The polymers that are being developed can be negative and/or positive photoresists. The invention can also utilize data processing methods that transform signals that characterize the state of the polymer processing so as to actuate discrete interconnected hardware elements or subsystems to perform certain functions such as repositioning the nozzle or changing the desired spin rate.

FIG. 2 shows another embodiment of the present invention which provides a multi-port nozzle 200 having an intake manifold 230 for receiving either one or two fluids having distinct chemistries. The intake manifold 230 may be formed with an intake partition 335 to separate or divide the incoming fluid stream(s) entering into the manifold. A selected fluid from the inlet manifold may be thus distributed between a first arm 210 and a second arm 220. Each arm 210 and 220 may have a distinct or identical arrangement of outlets 301 (as shown in FIG. 3) depending on the application for which the nozzle 200 is selected. The nozzle 200 may also have a width between a front face 205 and a back face equal to the diameter of a substrate wafer, thereby allowing the dispensed fluid to cover the whole wafer in one full rotation of the wafer.

FIG. 3 is a cross-sectional view of the nozzle 200 showing the inlet manifold 230 being divided to preferably receive two fluids which may have distinct chemistries such as developing fluid and deionized water (DI). The partition 335 divides the fluid streams in the inlet manifold 230. FIG. 3 shows the inlet manifold 230 guiding one fluid stream into a first inlet channel 340. The first inlet channel 340 includes a bend 342 that merges with a first tubular insert or conduit 345 in the first arm 210. The manifold 230 guides another fluid stream into a second inlet channel 360. The second inlet channel 360 includes a bend 362 that merges with a second tubular insert 365 in the second arm 220. Preferably, the outlets 301 on a bottom face 380 of the nozzle 200 are aligned linearly across the width of the nozzle 200 although alternative arrangements are possible and will be further described herein. The configuration of the nozzle 200 thus accommodates the use of two different developer fluid chemistries with temperature control without any cross contamination during dispensing. The nozzle 200 may be however adapted to allow for deionized water dispensing together with or separately from developing fluid dispensing. It shall be understood that the nozzle 200 or similar variation thereof may also be integrated into a single or dual chemistry version of the developer fluid.

An important feature relating to this aspect of the invention is that the impingement force generated with the nozzles herein is significantly reduced as compared to a single hole nozzle due at least in part to its multi-port characteristic or nature. The reduced impact force is notably important for smaller CD sizes that tend to have high aspect ratios since this makes them vulnerable to pattern collapse due to impact of the fluid. Embodiments of this invention may also simultaneously reduce impact forces for the developer fluids and the deionized water. The impingement forces throughout the develop process may be therefore minimized ensuring a reliable method of patterning smaller feature sizes with relatively higher yield than that provided by others alternatives known in the art. Another significant advantage of the multi-port nozzles herein is that they increase process latitude when used for both dispensing developer fluid and deionized water. In addition, the improved liquid delivery and distribution capability of these multi-port nozzles ensure better overall process compliance for mechanical process variables such as spin speed and fluid dispensing rate. Yet another added advantage provided by this invention is the potential to reduce the total develop process time while maintaining CD control as well as good defect and particle performance.

FIG. 4 illustrates another embodiment of the invention in which a multi-port nozzle 400 may dispense either one or two developing fluids, and/or deionized water. The nozzle 400 preferably dispenses two developing fluids and deionized water so that all dispensing may be accomplished by positioning the nozzle 400 in just one position over a substrate wafer. A head 420 of the nozzle 400 includes a top surface 425 having three inlets or inlet manifolds for receiving dispensing fluids and/or deionized water. As shown in FIG. 4, one preferred nozzle arrangement includes a first inlet 405 for a first developing fluid, a second inlet 410 for deionized water, and a third inlet 415 for a second developing fluid. Preferably, two or more of the inlets are staggered with respect to the top surface 425 to conserve space and reduce the overall width and size of the nozzle 400. The first inlet 405 may be staggered from the third inlet 415, with the second inlet centrally located and/or offset between the first inlet 405 and the third inlet 415. It shall be understood that the inlets need not be formed in a staggered configuration and may be formed along various regions of the nozzle.

FIG. 5 shows an end surface 520 of the head 420 which may be formed with internal manifolds shown as bored chambers that communicate with or correspond to each of the inlets shown in FIG. 4. The end surface 520 preferably includes a first manifold 505 merged or in communication with the first inlet 405 for the first developing fluid, a second manifold 510 may be merged with the second inlet 410 for deionized water, and a third manifold 515 may be merged with the third inlet 415 for a second developing fluid. Each of the manifolds may include a series of one or more tubular inserts 650 which dispense liquid from each respective manifold. To further reduce the dimensions of the nozzle, two or more of the manifolds may be staggered with respect to one another across the end surface 520. Preferably, the first manifold 510 is centrally located on the end face 520, with the second manifold 510 and third manifold 515 symmetrically distributed on either side of the first manifold 505 in triangular fashion as shown. Accordingly, another aspect of the invention relates to the staggering of the plurality of working fluid manifolds. By staggering the working fluid manifolds, the principle axes of the manifolds can be brought closer together than would otherwise be permitted by a non-staggered, non-intersecting configuration of the inner section of their radial bores. The overall width of the multi-port nozzle thus becomes smaller or narrower. Staggering the manifolds may be useful even if there are only two manifolds, especially where the volume defined by the extent of the manifold is increased due to the functional requirements of static pressure equalization among the ports.

FIG. 6 is a cross-sectional view of the nozzle head 420 shown in FIG. 4 that is cut along the longitudinal length A—A of the third manifold 515. The third manifold 515 may include a plurality of conduits 670 that are bored vertically through the bottom surface 680 along a vertical axis. The structure of the third manifold 515 is preferably identical to the first and/or second manifolds 505 and 510, and will be described in greater detail as representative of these manifold embodiments. As exemplified with respect to the third manifold 515, each of the conduits 670 formed in the manifold may include one or more tubular inserts 650 each having an internal end 660 and an external end 655. Preferably, the internal end 660 of each tubular insert 650 extends a distance or height internally into the third manifold 515 away from the manifold wall or surface. Fluid entering the third manifold 515 will not drain unless the level of the fluid compiled within the third manifold 515 exceeds the height of the internal end 660. As such, the internal ends 660 may define a reservoir having a depth defined from the internal end 660 of the tubular insert 650 to a bottom manifold surface 665. In this manner, the height of the internal end 660 may also be used to maintain the static pressure within the third manifold 615 constant or equal with respect to the corresponding fluid conduit 670. The external ends 655 of the insert tubes 650 may likewise extend beyond the bottom surface 680 of the nozzle 400.

The tubular inserts 650 herein may be formed to provide a very smooth internal surface that minimizes or eliminate surface flaws which may otherwise misdirect a stream of developing fluids or deionized water. The smooth surface the tubular inserts 650 may also avoid the sucking back of bubbles since the liquid-air interface within the tubular inserts may be controlled. The tubular inserts 650 also provide thin radial edges both inside the manifolds and outside of the nozzle which reduce the area of the tubular inserts that may contact the fluids passing through. This enables the nozzle 400 to avoid problems associated with fluid streams of developing fluids and/or deionized water that contact conduits, such as fluid clinging or other problems that cause streams to pull of center. The external ends 655 also extend sufficiently beyond the nozzle 400 to help avoid streams being pulled together on the bottom surface 680.

As with other embodiments described herein, this single multi-port nozzle may thus dispense two develop fluids having distinct chemistries, and also one rinsing deionized water (DI) chemistry through rows of holes that are strategically placed so that all dispensing can be done with one head position over a substrate wafer. This allows the use of a rotary cylinder actuator for head motion from a drain location to a single dispense location. No servo positioning control is further required. The DI row of holes is centered for rinse of the entire wafer. The developer chemistry rows are preferably placed 5 mm offset because process data discussed further below indicates that a 5 mm develop chemistry offset improves process results. Furthermore, the dispense holes can include pressed-in tubes with small radius ends. There are at least two qualities of these tubes that provide benefits. First, small radius ends provide relatively no surface that would allow a liquid to cling. Any liquid clinging at this bottom surface of the nozzle can cause dispensing streams to be pulled off center. It is also known that residual liquid on the bottom horizontal surface of the nozzle can cause two streams to join into one relatively larger stream. This can be especially problematic when it is critical that there is no contamination between the different chemistries on the head. Second, forming the tube tips with radial edges or ends, as with pressed-in tubes, allows a very smooth inner surface and substantially eliminates aberrations that may cause fluid clinging. In general, miniscule surface aberrations can cause streams to be misdirected. Rough surfaces also cause uncontrolled liquid clinging which can lead to chemistry drying and contamination. The chance of sucking back a bubble is thus decreased since this liquid-air interface shape is well controlled. The plenum bore positions may be staggered to allow 5 mm offset of developer to be maintained and allow three chemistry rows on a 1.5 in. wide head. All holes may be strategically placed along a one-piece dispense head. It shall be understood that these configurations and dimensions may be modified for particular applications in accordance with the invention.

FIG. 7 illustrates a preferred arrangement of outlets formed along the bottom surface 680 of the nozzle 400. The outlets may be arranged linearly as shown or staggered to reduce the amount of space occupied or to conserve real estate. As shown it this embodiment of the invention, a center row 710 of outlets 701 formed by the extended tubular insert ends may be connected to or lead from the second manifold 510 to distribute deionized water over an entire treated wafer substrate to be rinsed. Additional rows 705 and 715 of outlets may be coupled to the first manifold 505 and the third manifold 515 respectively to dispense at least one, and preferably two, developing fluids. As with other embodiments of the invention described herein, the design of this multi-port nozzle achieves delivery of both developer fluid and deionized water over a polymer layer to be developed on a substrate. The nozzle provides a geometry of outlets that are arranged to provide an optimal spatial liquid flow rate while minimizing dripping. The invention further helps prevent collapse of a developed resist structure or structures by reducing impact force of the liquid on the film. The multi-port nozzle may include nozzle inserts or tubular inserts in at least one or more of ports formed in the nozzle body. The inserts can be made of a material that has a low coefficient of friction (either static or dynamic) with respect to the working fluid of the nozzle. Additionally, this described embodiment of the invention includes such inserts having extended portions beyond the nozzle body material in which they are located. This extension can be observed internally whereby the inserts extend into the interior regions of the input manifold. The extensions can be also recognized externally whereby the inserts extend beyond the bottom of the body of the nozzle. An advantage of extending the inserts internally beyond the nozzle body is to permit the internal manifold to function as an air equalized reservoir thereby affecting an equalization of static pressure with respect to the ports. At the same time, an advantage of extending the inserts externally is to prevent accumulation of residual working fluid on the external bottom surface of the nozzle body notwithstanding any operational attempts to mitigate such residual accumulation by reversing the working fluid pressure to achieve suck-back.

FIG. 8 illustrates a perspective view of the nozzle 400 incorporating staggered or offset inlets 405, 410 and 415. The nozzle 400 may also be configured to be received by a pivotable mounting brackets on a first longitudinal end 820 for securing the nozzle to an arm or stand above a substrate wafer. The nozzle is also relatively compact with a preferred vertical height extending from the top surface 425 to the bottom surface of 1.5 inches. It shall be understood that the respective dimensions of this and other embodiments of the invention may vary in accordance with the selected processing or applications.

FIG. 9 is a cross-sectional view of the nozzle 400 taken along lines B—B of FIG. 4. The nozzle 400 as shown includes the first manifold 505 coupled to a first plurality of tubular inserts 650A. The second manifold 510 is likewise coupled to a second plurality of tubular inserts 650B, and the third manifold 515 is coupled to a third plurality of tubular inserts 650C. Each of the first, second, and third plurality of tubular inserts 650A–C preferably extend inwards into the respective first, second, and third manifolds 505, 510 and 515 so that the inward extensions 660A–C of each group of tubular inserts define a reservoir with the corresponding manifolds. The height of each reservoir within the manifolds 505, 510 and 515 may be individually set by the length of the respective inward extensions 660A–C as described in the accompanying text and figures below (see FIGS. 12–13).

FIG. 10 is another cross-sectional view of the nozzle 400 taken along lines C—C of FIG. 4. Each inlet may be coupled to a manifold as illustrated using one or more chambers associated or in communication with or forming a part of each respective manifold. As shown in FIG. 10, the first inlet 405 is coupled to the first manifold 505 with a first inlet chamber 1005, and the third inlet 415 is coupled to the third manifold 515 with a third inlet chamber 1015. The second manifold 510 may also run along a predetermined length of the nozzle body in between and substantially parallel to the first manifold 505 and the third manifold 515. A plurality of tubular inserts 650A–C may be again positioned in the nozzle body to provide a fluid pathway for the delivery of dispensed liquids leading from their respective manifolds and out of the nozzle 400.

FIG. 11 is yet another cross-sectional view of the nozzle 400 taken along lines D—D of FIG. 4. As with the other inlets and manifolds, the second inlet 410 may be coupled to the second manifold 510 as shown with a second inlet chamber 1010. It shall be understood however that other embodiments of the invention may include additional inlets coupled to more corresponding manifolds using similar configurations as shown herein which may be connected again with corresponding inlet chambers. Furthermore, as with other views of this embodiment of the invention, FIG. 11 also provides another perspective of the tubular inserts 650A=14 C extending from the bottom surface 680 of the nozzle 400 to avoid combining the ejected liquid streams stemming from the rows of tubular inserts for each of the different manifolds.

FIGS. 12A–B illustrate an embodiment of a tubular insert 650A which may be used with the multi-port nozzles in accordance with this aspect of the invention. As shown by FIG. 12A, the tubular insert 650A may include a substantially round cross-section 1210A. Other embodiments of the invention however may be formed with non-circular cross-sections, including square or polygonal geometries. Inserts having these and other configurations can be selected to perform the function delivering manifold fluids out of the nozzle body in relatively parallel streams of liquid which do not substantially interfere with each other. Furthermore, the height of the tubular insert 650A may be set by either the vertical position of the manifold that retains the tubular insert or the desired depth of the reservoir defined by the internal end 660A of the tubular insert. FIG. 12B shows the tubular insert 650A having a relatively shorter height for manifolds that are closer the bottom surface 680 of a nozzle 400 such as the first manifold 505 or also the third manifold 515. But the overall height or length of this tubular insert 650A may again vary depending on factors such as: the overall dimensions and height of the nozzle, the desired external extension of the insert leading away from the bottom surface of the nozzle, and the desired height of the formed reservoirs within a particular manifold. The tubular insert 650A may be also used to define a more shallow reservoir within a manifold relatively further away from the nozzle bottom surface such as the second manifold 510.

FIGS. 13A–B illustrate yet another tubular insert which may be incorporated into the dispense nozzle heads herein. As with previous described embodiments of the invention, the tubular insert 650B may include a substantially round cross-section 1210B shown in FIG. 13A but may also be formed of other shapes as other manifold inserts described herein. Furthermore, the tubular insert 650B may be also formed with a relatively longer length than the insert 650A shown in FIGS. 12A–B. A longer insert may be preferred for a manifold that is formed along the nozzle body that is relatively more distant from the bottom surface 680 of the bottom surface of the nozzle with respect to the other manifolds therein. As such, the tubular insert 650B is preferred for a manifold such as the second manifold 510. The tubular insert 650B as shown in FIG. 13B may also be used to create a relatively deeper reservoir within the first manifold 505 or the third manifold 515. For an optimal nozzle having a depth or height of 1.5 inches, the tubular inserts may be formed with a length ranging from between 0.352 inches and 0.665 inches as shown respectively by FIGS. 12B and 13B.

FIG. 14 is a cross-sectional perspective view of the nozzle 400. The first inlet 405 and the second inlet 410 are shown in an off-center or staggered arrangement on the top surface 425 of the nozzle 400. The end face 520 includes the first manifold 505 and the second manifold 510. The second manifold 510 may be viewed as exemplary for other manifolds in this embodiment, and will be described in greater detail. The second manifold 510 includes an enlarged chamber 1410. The enlarged chamber 1410 merges with a bored segment 1420 forming the remainder of the second manifold 510. The second inlet chamber 1010 couples second inlet 410 with the second manifold 510. The tubular inserts 650B extend through the conduits so that the exterior end 655 extends beyond the bottom surface 680. Similarly, the interior end 660 forms a height 1430 above or over the second manifold bottom surface 665 that defines a depth of the reservoir formed therein when the second manifold 510 receives fluid. In this way, fluid such as deionized water may be received through the second inlet 410 and travel through the bored segment 1420 of the second manifold 510. Prior to the level of the fluid exceeding the insert height 1430, the fluid forms a reservoir within the second manifold 510. Once the fluid level exceeds or passes above the insert height 1430, fluid may then enter the tubular inserts 650B through the interior ends 660 thereof and pass through and out of the exterior end 655 leading away from the nozzle as fluid jet streams towards a wafer substrate. The resulting outflow of the nozzle 400 may dispense liquid such as deionized water to provide a fine disbursement of rinsing fluid.

Another aspect of the invention is directed to methods of dispensing develop fluids to minimize precipitation of developing reactant. This may be accomplished with the multi-port nozzles provided herein. For example, a method is provided herein for minimizing precipitation of developing reactant by lowering a sudden change in pH. A portion of a polymer layer may be initially developed on a substrate with a charge of developer fluid. The charge of developer fluid may be permitted to dwell on the polymer so as to controllably minimize a subsequent sudden change in pH. The polymer may thereafter be rinsed with a charge of another fluid. In another embodiment of the invention, the initial charge of developer fluid may be rinsed with yet another additional charge of the developer fluid so as to controllably minimize a subsequent sudden change in pH. The polymer may similarly be rinsed with a charge of another fluid. In yet another embodiment of the invention for minimizing precipitation of developing reactant by lowering a sudden change in pH, the following steps may be followed: (1) developing at least a portion of a polymer layer on a substrate with a charge of developer fluid; (2) contacting the substrate with a charge of buffer, thereby mixing at least a portion of the developer fluid with at least a portion of the charge of buffer so as to controllably minimize a subsequent sudden change in pH; and (3) subsequently rinsing the polymer with a charge of another fluid. This aspect of the invention may help prevent the collapse of a developed resist structure or structures, which may be due in part at least by reducing a sudden change in pH. The term "sudden" as used herein to characterize a change in pH may be defined as a change in pH with respect to time that includes two inflection points separated by a period of time of less than approximately 1.0 second, preferably less than approximately 0.1 second, and more preferably less than approximately 0.01 seconds. The nearly congruent occurrence of two inflection points can be termed a step function.

The multi-port nozzle apparatus and systems described herein may be incorporated into a variety of develop fluid modules to perform selected processing functions. While not being limited to any particular performance indicator or diagnostic identifier, some of the preferred embodiments of the invention can be studied and identified one at a time by testing for the presence of a substantially uniform develop rate across the surface of a wafer. The test for the presence of a substantially uniform develop rate can be carried out without undue experimentation by the use of the simple and conventional IPEC Awmap rate map or spinning rate test. A spinning rate test was performed to determine how much offset between the center of a spinning wafer and the nearest develop stream could be tolerated during developer dispense. The criteria used was to increase offset until the develop uniformity suffered. This is important limitation to know as such an offset is inherent in most of the dispense nozzle designs including those herein which may be considered for use with a variety of develop modules.

FIGS. 15–18 provide results of a develop test on wafers with nozzle offsets of 0, 5, 10 and 20 mm at the same time while varying the spin during dispense between 60 and 2500 rpm. The test found that an offset at least as great as 5 mm had no adverse impact on develop uniformity across the wafer. Presumably a nozzle design with an offset of 5 mm or less should not cause develop non-uniformity at the center of the wafer. At some point between 5 and 10 mm, fluid no longer wets the center of the wafer and develop there is greatly suppressed. The spin speed of the wafer interacts with the offset somewhat, and is most apparent at the marginal offset of 10 mm.

A preferred embodiment of the invention includes a multi-port nozzle as described herein having three parallel rows of holes in a bar or nozzle body that is formed of a length that is equal to approximately one substrate wafer radius long. This single nozzle could thus dispense both deionized (DI) water and developer fluid without repositioning of the nozzle. Since the radial positioning of a nozzle arm over the wafer is typically accomplished with a pneumatic cylinder, there will be only one placement of the nozzle relative to the wafer regardless of which fluid is dispensed. Therefore, only one set of holes can be exactly over the center of the wafer, and it is expected that DI dispense should take precedence in which dispensed fluid gets to be closest to or released nearest the wafer center. Moreover, the typical develop process dispenses fluid on a spinning wafer, so centrifugal force will prevent fluid from reaching the center if it is dispensed too far out. Tests were therefore performed to determine how far off-center the develop dispense could be before develop rate uniformity across the wafer was affected. More specifically, developer fluid was dispensed at fixed offsets of 0, 5, 10 and 20 mm from the center. Initial spin during the dispense was also varied, as the difference in centrifugal force could interact with the centering offset to affect developer reaching the center of the wafer. Speeds of 60, 600, 1200 (standard), and 2500 rpm were used.

Referring to FIGS. 19A–22D, a sub-develop technique was chosen as a measure of develop quality for several reasons including: (1) it is fast relative to line width measurements; (2) it has more resolution that line width or E° measurement, and is less subjective than E° measurement; (3) the entire wafer area can be used, as opposed to a few discrete locations; and (4) with exposures and develop rates well above those for E°, the effect of the develop process is much more dominant compared to the contributors to develop rate, such as the swing curve, Microscan intensity uniformity, PEB uniformity, etc. As the resist film approaches complete deprotection, development trends toward a simple etch process.

In addition to the qualitative measure of color uniformity across the wafer after development, resist removal differences across the wafer were quantified with IPEC Acumap thickness measurement system. Although this tool measures thickness at 1 mm intervals across the entire wafer (greater than 30,000 locations), as a practical matter only the thickness at the center of 121 exposure fields were used for the calculations in this report. The baseline chemistry, TOK9, and process were used for the test. The develop recipe was modified to remove arm movement during develop and DI dispenses. A preferred embodiment of the nozzle was used for develop dispense. It was adjusted so the centermost hole was over the center of the wafer with 0.0 offset in the arm program. The puddle portion of the development process was shortened from 60.5 to 5.5 seconds. The exposure dose used was 12 mJ/cm. (E° dose is approximately 6.5–7.0 mJ/cm). The developer flowmeter was set to approximately 3.8, and although volume was not checked, past experience with this meter is that it should be about 50 ml. All wafers were processed at one time through PEB, then separately into the developer, where parameters were varied for each wafer in randomized order.

Develop rates were determined by first subtracting the resist thickness at the 121 locations after develop from the thickness measured on two of the wafers after PEB, just prior to develop. In this approach, it was assumed that wafer-wafer differences in pre-develop thickness were relatively negligible, and a representative wafer could be the "before" wafer for all rate calculations. The resist removed was divided by the develop time (dispense+puddle+refresh), 10 seconds for all wafers in this test.

Measuring initial thickness between PEB and develop is notable for two reasons. First, many of the prior develop rate calculations have been done using the thickness before exposure. Since the thickness loss was about 1000 Å from the original 8500Å, this should be a more accurate estimate of the develop rate. Second, the exposed areas were clearly visible, and a characteristic pattern across the wafer was seen on every wafer. This is useful as a metric of relative deprotection across the wafer, and some papers have also noted this. It has the desirable property of being independent of the develop process.

The develop portion of the recipe used is as follows:

| Operation | Time (sec.) | Speed (rpm) | Arm X (mm) |
|---|---|---|---|
| Spin | 1.0 | 60–2500 | 0–20 |
| Develop Dispense | 1.0 | Same | Same |
| Develop Dispense | 2.0 | 20 | Same |
| Spin | 6.5 | 0 | Same |
| Spin | 0.5 | 1200 | Same |

Results for this test are summarized in the table below:

| Arm X Mm | Speed rpm | Ave. Rate Å/sec. | Stdev Rate Å/sec. | % unif (σ/ave) | % unif (mg/ave) | Max. Rate Å/sec. | Min. Rate Å/sec. | Range Rate Å/sec |
|---|---|---|---|---|---|---|---|---|
| Each row below corresponds to individual wafers ||||||||||
| 0 | 60 | 610.9 | 28.2 | 4.6% | 20.5% | 679.8 | 554.6 | 125.2 |
| 0 | 600 | 639.3 | 2406 | 3.8% | 16.6% | 698.7 | 592.6 | 106.1 |
| 0 | 1200 | 608.9 | 21.9 | 3.6% | 14.4% | 660.7 | 572.8 | 87.9 |
| 0 | 1200 | 611.2 | 24.1 | 3.9% | 17.6% | 677.0 | 569.6 | 107.4 |
| 0 | 2500 | 646.6 | 26.4 | 4.1% | 20.6% | 728.3 | 595.1 | 133.2 |
| 5 | 60 | 610.0 | 31.1 | 5.1% | 20.6% | 685.7 | 560.3 | 125.4 |
| 5 | 600 | 622.7 | 28.9 | 4.6% | 20.8% | 707.1 | 577.8 | 129.3 |
| 5 | 1200 | 638.8 | 24.4 | 3.8% | 16.8% | 698.0 | 590.8 | 107.2 |
| 5 | 2500 | 647.7 | 23.4 | 3.6% | 17.1% | 711.9 | 600.8 | 111.1 |
| 10 | 60 | 582.6 | 29.2 | 5.0% | 21.1% | 656.3 | 533.6 | 122.7 |
| 10 | 600 | 639.9 | 25.9 | 4.0% | 20.2% | 724.3 | 595.1 | 129.2 |
| 10 | 1200 | 606.3 | 30.7 | 5.1% | 42.0% | 690.4 | 435.9 | 254.5 |
| 10 | 2500 | 639.8 | 32.7 | 5.1% | 46.7% | 712.4 | 413.4 | 299.0 |
| 20 | 60 | 607.9 | 63.8 | 10.5% | 112.9% | 686.8 | 0.7 | 686.1 |
| 20 | 600 | 593.8 | 60.0 | 10.1% | 113.4% | 672.5 | −1.0 | 673.4 |
| 20 | 1200 | 629.4 | 66.6 | 10.6% | 114.9% | 723.1 | −0.3 | 723.4 |
| 20 | 2500 | 639.0 | 64.9 | 10.2% | 112.0% | 717.1 | 1.2 | 716.0 |
| rows below group previous data by either arm position or spin speed ||||||||||
| All | 60 | 602.8 | 42.4 | 7.0% | 113.8% | 686.8 | 0.7 | 686.1 |
| All | 600 | 623.9 | 42.1 | 6.7% | 116.2% | 724.3 | −1.0 | 725.2 |
| All | 1200 | 618.9 | 39.5 | 6.4% | 116.9% | 723.1 | −0.3 | 723.4 |
| All | 2500 | 643.3 | 40.4 | 6.3% | 113.0% | 728.3 | 1.2 | 727.2 |
| 0 | all | 623.4 | 29.8 | 4.8% | 27.9% | 728.3 | 554.6 | 173.7 |
| 5 | all | 629.8 | 30.7 | 4.9% | 24.1% | 711.9 | 560.3 | 151.6 |
| 10 | all | 617.2 | 38.3 | 6.2% | 50.4% | 724.3 | 413.4 | 310.9 |
| 20 | all | 617.5 | 66.1 | 10.7% | 117.2% | 723.1 | −1.0 | 724.1 |

-continued

| Arm X Mm | Speed rpm | Ave. Rate Å/sec. | Stdev Rate Å/sec. | % unif (σ/ave) | % unif (mg/ave) | Max. Rate Å/sec. | Min. Rate Å/sec. | Range Rate Å/sec |
|---|---|---|---|---|---|---|---|---|
| Rows below are grouped as in previous section, but with center data point removed ||||||||||
| All | 60 | 604.1 | 32.4 | 5.4% | 30.1% | 686.6 | 505.0 | 181.8 |
| All | 600 | 625.1 | 30.8 | 4.9% | 37.8% | 724.3 | 487.7 | 236.6 |
| All | 1200 | 620.3 | 29.6 | 4.8% | 33.7% | 723.1 | 513.9 | 209.2 |
| All | 2500 | 645.1 | 26.0 | 4.0% | 33.2% | 728.3 | 514.0 | 214.3 |
| 0 | all | 623.4 | 29.9 | 4.8% | 27.9% | 728.3 | 554.6 | 173.7 |
| 5 | all | 629.9 | 30.8 | 4.9% | 24.1% | 711.9 | 560.3 | 151.6 |
| 10 | all | 617.9 | 35.9 | 5.8% | 30.9% | 724.3 | 533.6 | 190.7 |
| 20 | all | 622.7 | 34.6 | 5.6% | 37.8% | 723.1 | 487.7 | 235.4 |

Overall, the relatively clear break in the data is between 5 and 10 mm offset. Five may be slightly better than 0; 20 is the worst. The primary effect is the arm position, but the spin speed during dispense can be seen, particularly for the 10 mm offset. Predictably, the single point at the center is responsible for much of the non-uniformity especially for 10 and 20 mm. To capture the variation between the center and the rest of the wafer, the range is a more useful measure of uniformity here than is standard deviation, where the other 120 points tend to dilute the center.

A third order polynomial line is fitted through the data to ease comparison between the different spin speeds, as there is quite a bit of scatter in the data. FIGS. 15–18 confirm the trends seen in the tables: the primary non-uniformity is between the center and the rest of the data for the higher speeds, 0 and 5 mm are clearly more uniform than the higher offsets, and at 10 mm there is an interaction between offset and speed.

FIGS. 19A–22D show the IPEC maps for all the wafers, except for one repetition. The resolution of these IPEC maps reproduced herein may be noticeably better on a computer monitor. Viewing such maps on a monitor also provides an advantage of being able to zoom in on certain areas of particular interest within the map. The rate range spanning the different colors shown is held constant so that relative uniformity can be compared between wafers. The gray and white areas are off the scale. It can be seen here in the IPEC maps provided, as was apparent visually on the wafers themselves as well, that starting with 10 mm offset, a "hole" forms in the center where little or no develop fluid contacts the wafer, and which has a much lower develop rate. The tests confirmed that some offset from the center is tolerable for developer dispense, at least up to 5 mm. At some point between 5 and 10 mm offset from the center and the nearest develop stream, fluid ceases to contact the center of the wafer, resulting in an area with greatly suppressed develop rate, and no doubt catastrophic yield loss on a customer wafer. Larger offsets may further exacerbate the effect. It should be noted that there is a mild interaction with the spin speed used as the fluid first touches the wafer, showing up mainly at the apparently marginal condition of a 10 mm offset. The uniformities measured were actually slightly better for the 5 mm offset than for 0, but it is probably not a significant difference in this test as conducted. In summary, this set of results indicate that the nozzle design should not cause develop rate non-uniformities at the center of the wafer so long as the centermost stream is not more than 5 mm from the center.

Another aspect of the invention incorporates the use of pressurized gas with dispensing nozzles and external nozzle surface modifications to assist in the reduction cross-contamination between dispensed liquids. In practice, cross-contamination often occurs by at least two mechanisms: (1) small quantities of liquid dispensed from adjacent nozzles may migrate laterally under the action of pressure gradients derived from surface tension of the particular liquids; and (2) small quantities of liquid dispensed from a nozzle may also rebound in droplet form subsequent to impinging upon a wafer surface that may be in relatively close proximity to a nozzle exit plane defined by the distance a nozzle insert may be extend beyond the bottom nozzle surface. To mitigate such cross-contamination, various embodiments of the invention may include substantially concave or undulating surface(s) about different regions of liquid dispensing nozzles. These concave surfaces may act as physical barriers or trenches between adjacent nozzle tubes to trap or confine laterally migrating liquid. Additionally, other embodiments may also include one or more gas orifices flanking or surrounding various regions about a liquid dispensing nozzle. These gas orifices may provide or generate a "gas curtain" around the liquid jets emanating from the various dispensing tubes of liquid dispensing nozzles including those provided herein. These and other advantages associated with these aspects of the invention may described in further detail with reference to the following description and figures.

Figure 23:
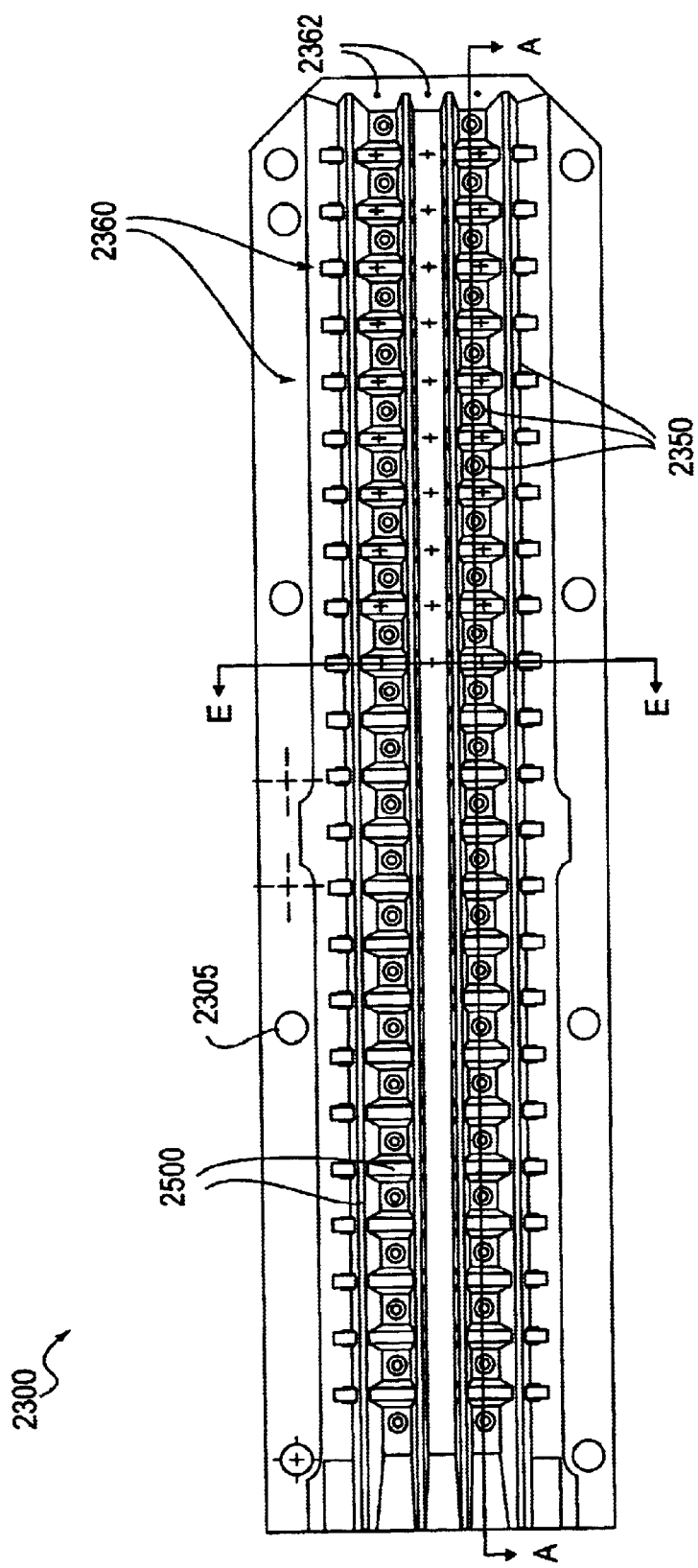
FIG. 23 is a bottom view of a multi-port nozzle formed with gas orifices that emit pressurized gas to assist in the reduction of cross-contamination of dispensed fluids and unwanted collection of fluids on the nozzle bottom surface.

As with other liquid dispense nozzles described herein, various modifications can be made according to the size of semiconductor wafers with which the nozzle may be used. For example, a dispense nozzle 2300 may be modified for operation with 300 mm semiconductor substrate wafers as shown in FIG. 23. The overall length of the nozzle 2300 may be up to 6 in. or greater, and its width may be up to 1.5 in. or greater. The external bottom surface of the nozzle 2300 may be formed or include a series of one or more physical structures which mitigate cross-contamination between adjacent liquid dispensing nozzles (e.g., 650A–C in FIGS. 9–11). As a result, the liquid dispensing nozzle tubes 2350 may be relatively isolated from each other or neighboring nozzle tubes by a trench-like grid 2500. Many other nozzle dispensing member geometries are immediately apparent to the skilled person besides a tubular configuration. Furthermore, the grid 2500 may be formed in a variety of ways including the removal of material surrounding the base of the tubular inserts 2350 at the nozzle body in order to form a trench. These physical barriers may be also formed by other techniques such as building up or adding onto the area surrounding the base of the inserts which may add to the overall height of the nozzle 2300 and length of the tubular nozzle inserts 2350.

The nozzle 2300 shown in FIG. 23 is further illustrated with gas orifices 2360 that are located within and/or around the formed trenches thus providing one or more gas curtains for the liquid dispensing nozzles. The nozzle may be connected to a source of pressurized gas such as nitrogen, air, or any other substantially inert gas. Incoming gas from an external source may be directed into the nozzle 2300 through one or more inlets and out through the gas orifices 2360. Gas orifices may be formed at selected locations along the bottom surface of the nozzle 2300, including end orifices 2362 formed at an end region of the nozzle, to channel the streams of dispensed fluids. Typically, the gas supply pressure into the nozzle 2300 is up to about 100 PSIG or greater, and typical gas volume flow rates are up to 100 l/min. It was found that cross-contamination may be substantially eliminated at a wafer/liquid-dispensing nozzle separation distance of 13 mm at spin speeds (wafer relative to liquid-dispensing nozzles) up to 2000 rpm. The nozzle 2300 may be also formed with various openings 2305 to accommodate fasteners which mount it to a robot arm thereby controlling movement and the separation distances between the nozzle and a substrate wafer. The plurality of gas orifices as shown may thus form an organized network of gas blankets or curtains to direct the flow of dispensed liquids to reduce cross-contamination. The momentum generated by these gas curtains may have at least two prophylactic effects. Firstly, the relatively lateral migration of dispensed liquid is at least mitigated, if not eliminated entirely, since laterally migrating liquid would be swept away from the nozzle body by the gas. Secondly, the gas momentum substantially normal to a nearby wafer surface may act to prevent or at least mitigate the amount of liquid or droplets rebounding towards the nozzle from the wafer surface. It shall be understood that while the illustrated embodiments herein incorporate more than one aspect of this invention, nozzles may be also formed with trenches covering only a certain defined portions thereof and/or include gas orifices covering substantially the entire underside of the nozzle body.

Figure 24:
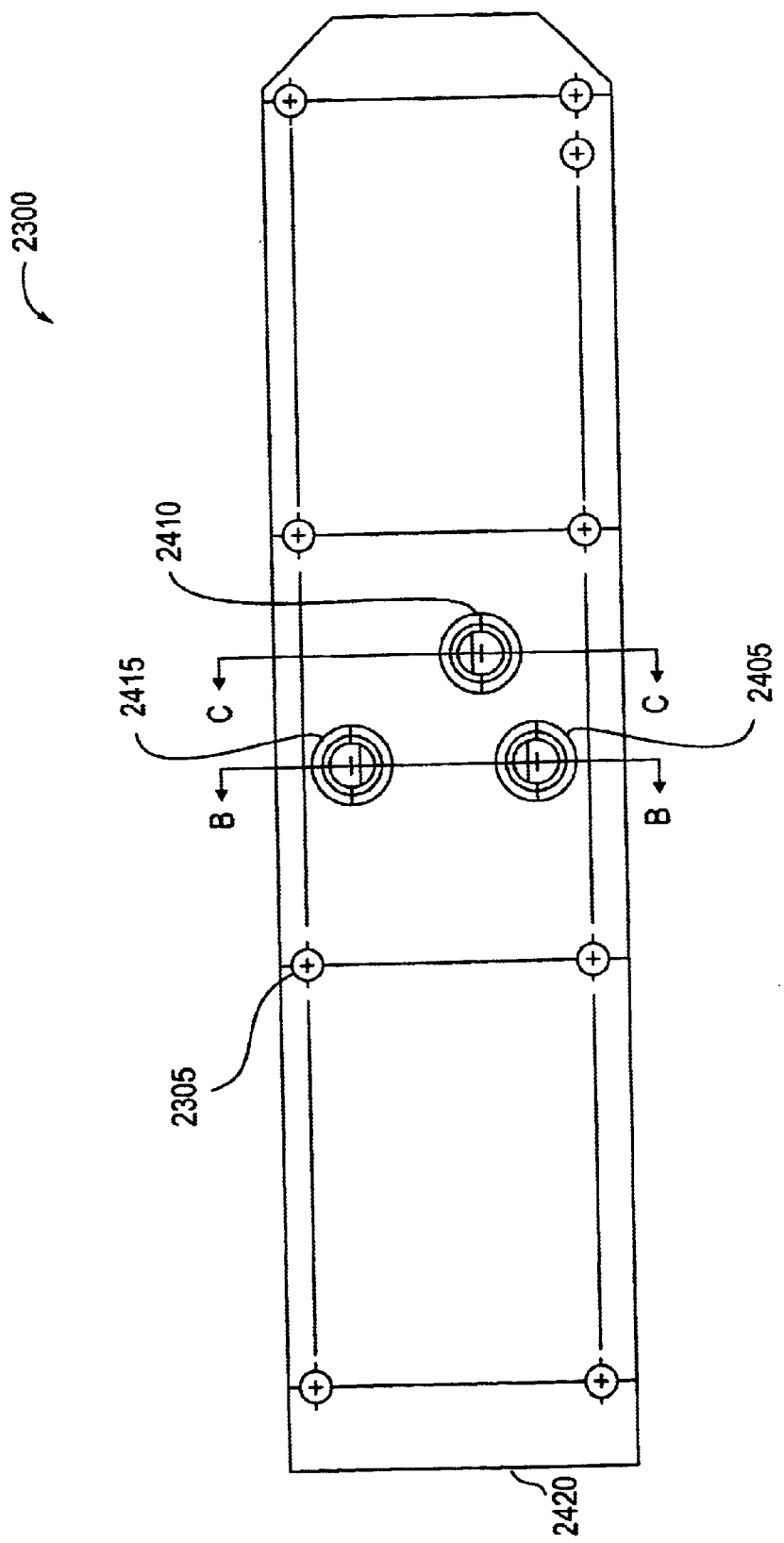
FIGS. 24–25 are top views of multi-port nozzles having three inlet openings formed on the top surface of the nozzle for processing of different sized wafer substrates.
Figure 25:
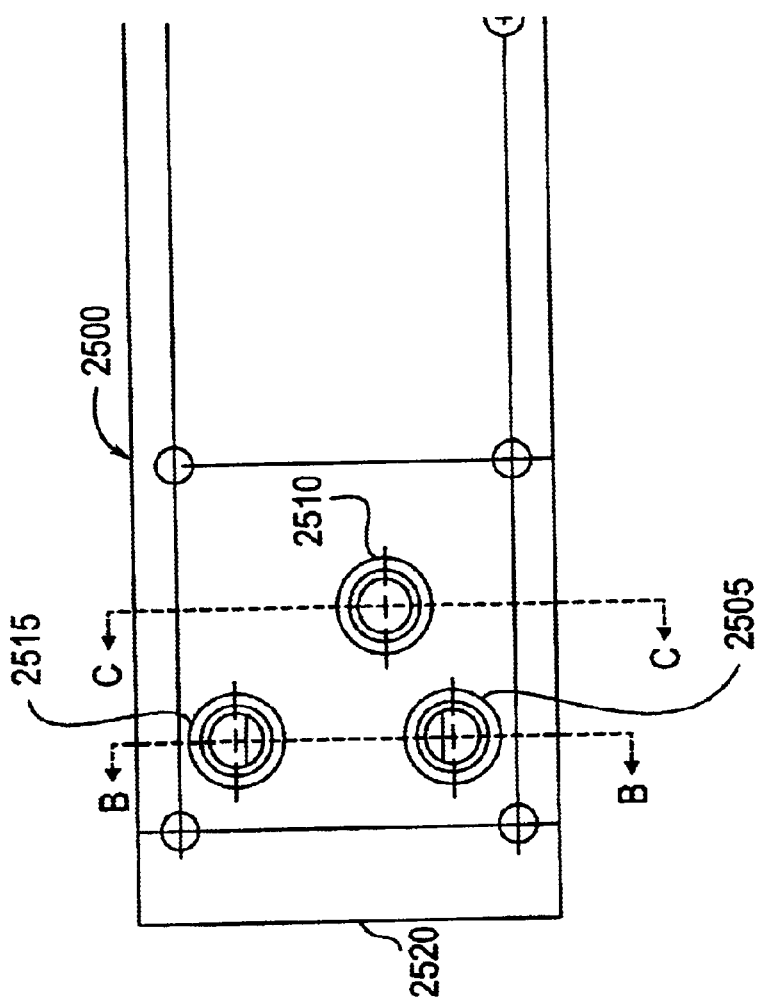

FIGS. 24–25 are top views of the multi-port nozzles which show three inlets formed along the top surface of the nozzle. As with other embodiments of the invention, a first inlet 2405 may be formed as shown in FIG. 24 which leads to a corresponding manifold. The nozzle 2300 may also include a second inlet 2410 and a third inlet 2415 positioned on opposite sides of the first inlet 2405 each in fluid communication with a separate manifold formed within the nozzle to also direct dispensed fluids such as deionized water and developer. It shall be further observed that inlets may be formed at various positions along the top surface of the nozzles herein. The inlets may be thus formed at a predefined distance that is relatively further away in reference to a nozzle end 2420 and at a relatively central region of the nozzle for processing of relatively larger wafers such as 300 mm wafer substrates. As shown in FIG. 25, other embodiments of the invention may include a multi-port nozzle 2500 configured for operation with relatively smaller structures such as 200 mm wafer substrates. This relatively shorter nozzle 2500 may be formed have an overall length of about 4.3 in. and a width of about 1.5 in. A series of inlets 2505, 2510 and 2515 may be also formed as described herein to dispense various fluids. The inlets in this illustrated embodiment are formed a predefined distance that is relatively closer in reference to a nozzle end 2520 and are substantially near an end portion of the nozzle 2500. The overall dimensions of the nozzles herein and positioning of nozzle inlets may be modified in accordance with selected applications.

Figure 26A:
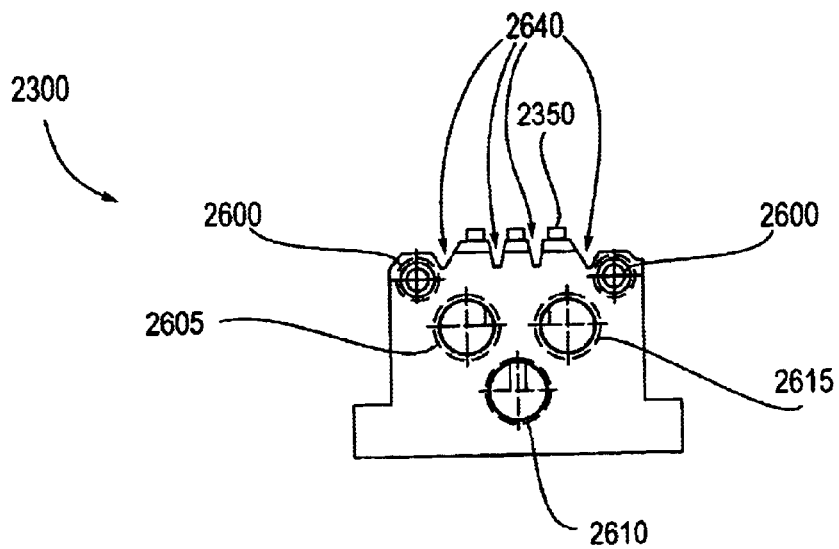
FIGS. 26A–B are side views of another multi-port nozzle that may formed with bored through fluid openings at an end surface of nozzle body which may be capped or plugged for channeling dispensed liquids and compressed gas.
Figure 26B:
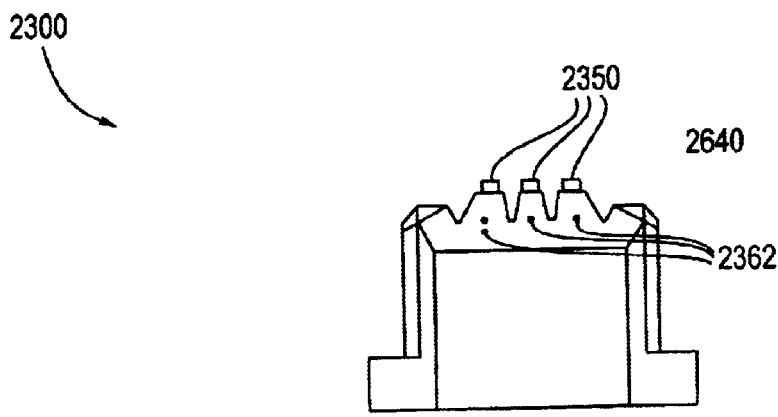

FIGS. 26A–B show the opposite end portions of a multi-port nozzle 2300 (see FIG. 23). As shown in FIG. 26A, a series of manifolds 2605, 2610 and 2615 may be formed along a substantially longitudinal length along the nozzle 2300 as with other embodiments of the invention described herein. A series of tubular inserts 2350 may be positioned in the nozzle 2300 to provide fluid channels leading from the manifolds out away from the nozzle. While the illustrated manifolds may be bored as shown, it shall be understood that the end portions of the manifolds may be subsequently closed or plugged thereby allowing fluid only to enter through their respective inlets and escape through the nozzle inserts as with other manifolds described herein. Furthermore, one or more gas manifolds 2600 may be formed for receiving incoming pressurized gas to create the blankets of gas which help reduce cross-contamination between dispensed liquids from adjacent nozzle inserts 2350. The gas manifolds 2600 may be in fluid communication with the various gas orifices which may be formed along the bottom surface of the nozzle 2300 including a series of end orifices 2362 as shown in FIG. 26B. Additionally, as shown in FIGS. 26A–B, the bottom nozzle surface surrounding the base of the nozzle inserts 2350 may be configured to provide a series of one or more trenches 2640 to provide a degree of physical separation between the inserts and the liquid to be dispensed therefrom. Either alone or in combination with one another, the trenches 2640 and gas blankets formed around the nozzle inserts assist in preventing cross-contamination and splashback caused by fluid rebounding from the surface of a spinning wafer substrate.

Figure 27:
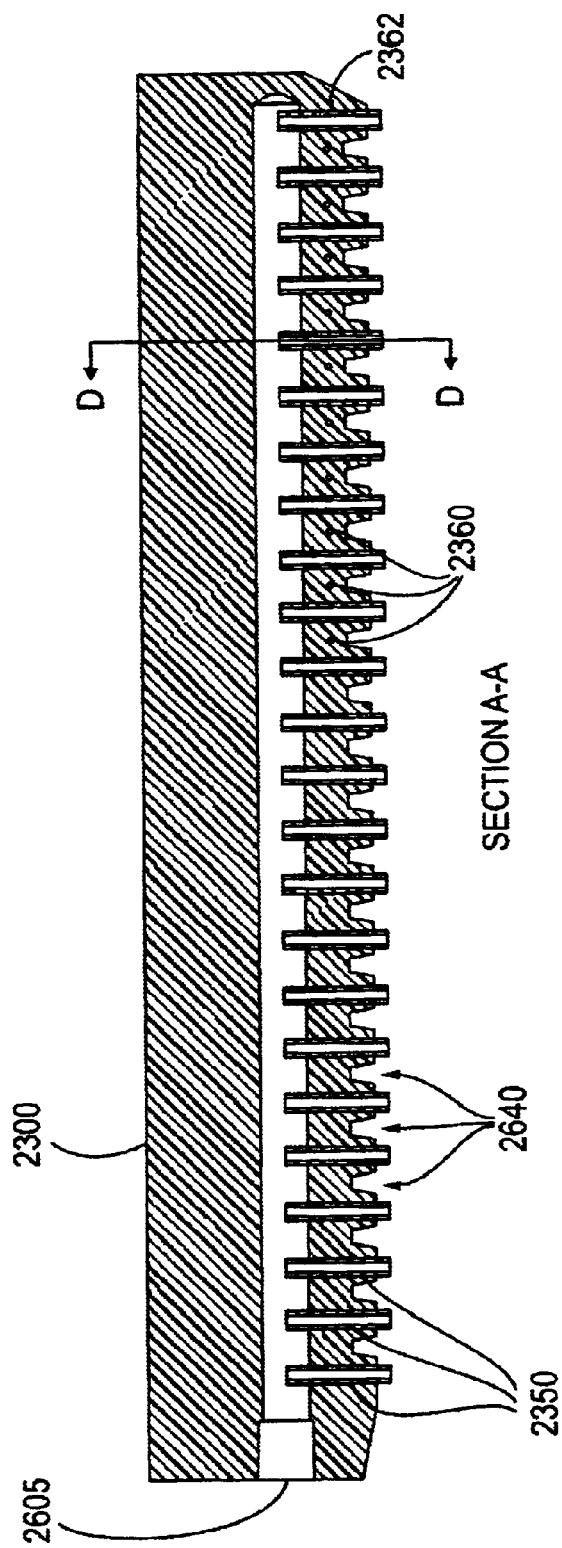
FIGS. 27–31 are cross-sectional views of the multi-port nozzle shown in FIG. 23 taken along section lines A—A through E—E, respectively.

As shown in FIG. 27, a cross-sectional view of the multi-port nozzle 2300 of FIG. 23 taken along the lines A—A, the first manifold may run substantially along the length of the nozzle 2300. A plurality of tubular inserts or nozzle tips 2350 may be inserted into openings formed throughout the bottom surface of the nozzle 2300. Another aspect of the invention is directed to the manufacturing method of installing these nozzle tips into the nozzle body. These tips 2350 may be formed of or selected from a variety of materials that preferably provide relatively smooth surfaces such as Teflon, and undergo shrinkage or contraction upon exposure to cold temperatures. These and other nozzles herein may be frozen or exposed to a sufficiently cold temperature so they undergo thermal contraction prior to insertion into the nozzle openings leading to there respective manifolds. A predefined period of cooling time of up to 48 hours or more may be selected depending upon various factors including the selected temperature and degree of desired contraction. The tips can be thus pressed-in to readily position them within a desired depth within the nozzle thereby creating the desired reservoirs described herein. Upon warming of the tips by heating methods or exposure to a relatively warmer temperature, the tips may undergo thermal expansion thereby creating a snug fit or relatively liquid tight seal with the nozzle body. Furthermore, as with other described embodiments of the invention, selected regions of the bottom nozzle surface surrounding the base of the nozzle tips 2350 may be built-up or etched away to form a series of trenches 2640 to maintain a desired level of separation between ejected liquid streams and to trap or channel fluid therein. In regions of the nozzle that are formed with gas orifices 2360 in between nozzle tips 2350, liquid channeled within the trenches 2640 may be also forced or blown away by the pressurized gas released through the orifices 2360 and 2362. These and other liquid dispensing nozzle tips herein may be thus flanked or surrounded with gas orifices and substantially concave surfaces which form a network of trenches. While these nozzle tips are described as individual pieces or components to be connected with the nozzle body, it shall be understood these and all other embodiments herein may be integrally formed with the body as nozzle extensions thus forming a unitary piece or by single-piece construction.

Figure 28:
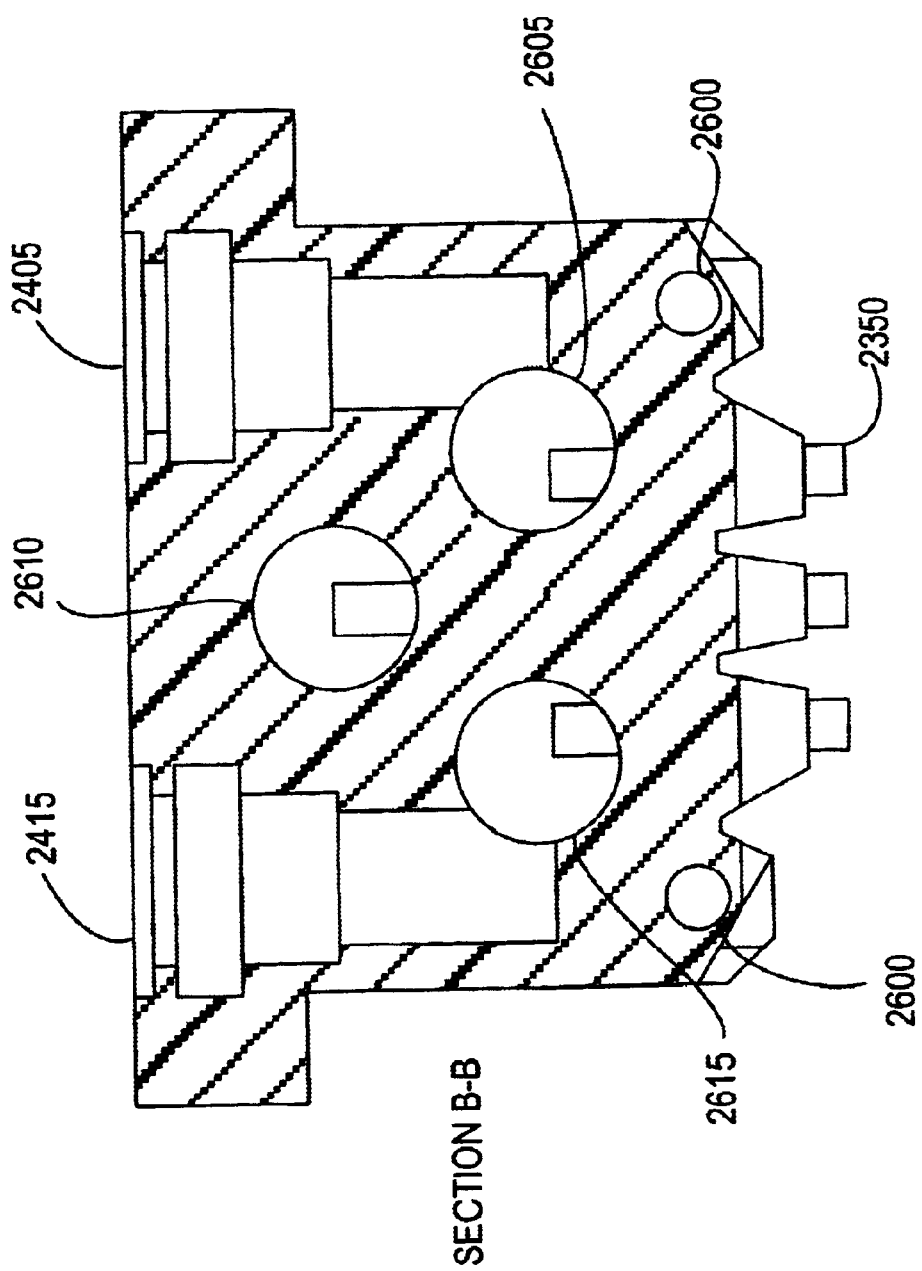
Figure 29:
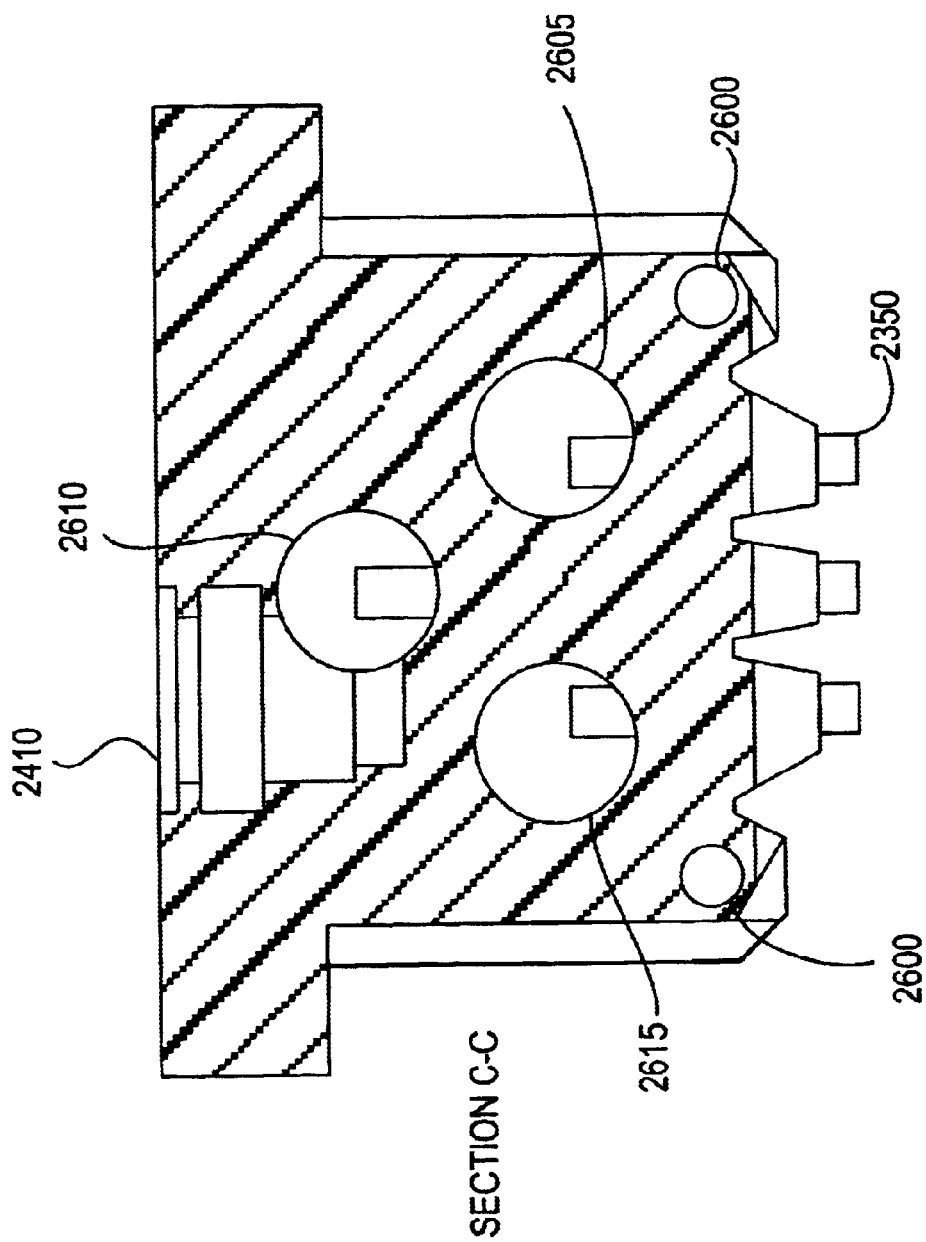

FIGS. 28–29 are cross-sectional views of the nozzle 2300 shown in FIG. 24 taken along longitudinal lines B—B and C—C respectively. These figures illustrate a plurality of manifolds 2605, 2610 and 2615 and respective inlets 2405, 2410 and 2415 which are similar to those described herein. A series of relatively longer and shorter tubular inserts are positioned within nozzle 2300 to direct the variety of fluids which may be dispensed. Additionally, gas manifolds 2600 are also provided in the nozzle body as illustrated. It shall be understood that while two gas manifolds are illustrated, nozzles may be also formed with only one or several gas manifolds throughout the nozzle body which may also run along a relatively longitudinal length substantially parallel to the dispense manifolds or across the nozzle width.

Figure 30:
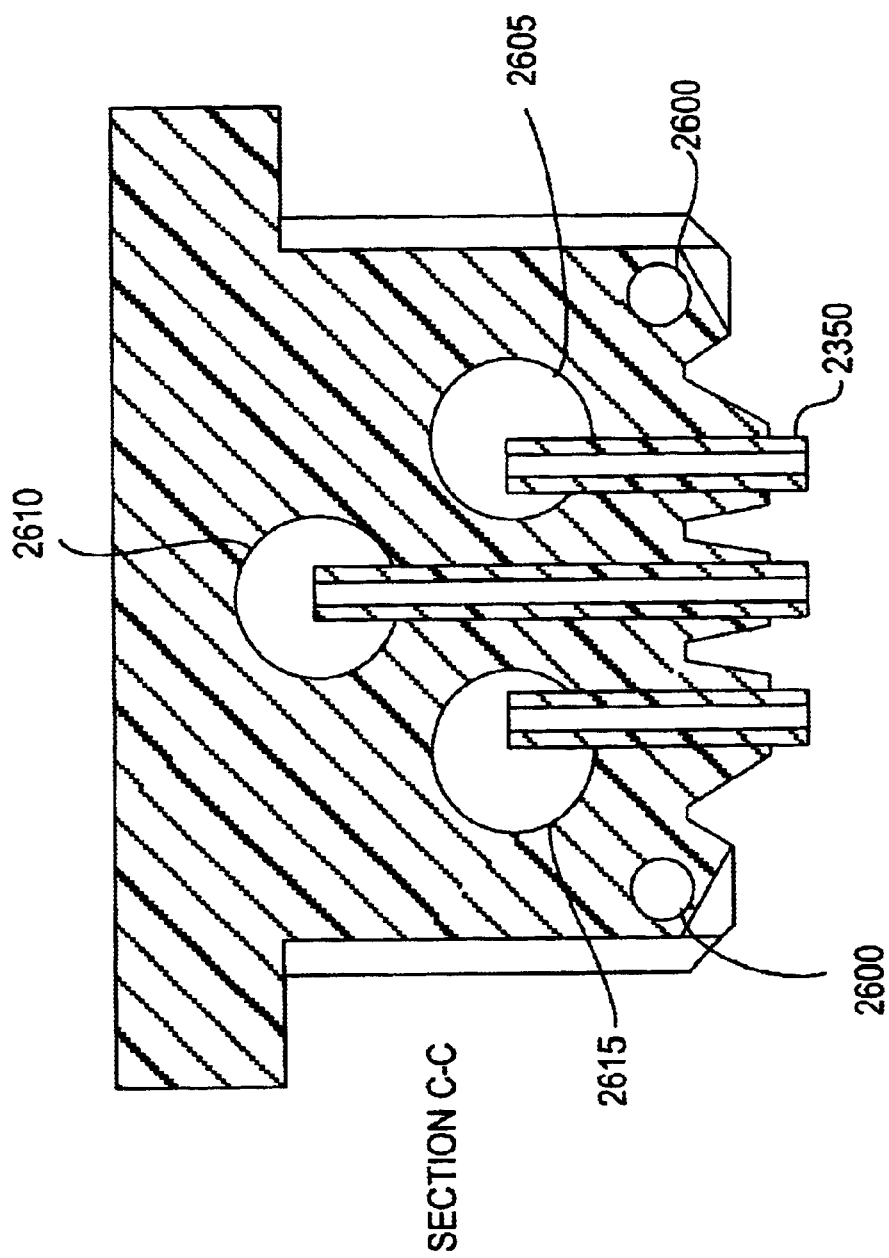

Another cross-sectional view is provided in FIG. 30 which is taken along longitudinal line D—D of the illustrated embodiment in FIG. 27. The gas manifolds 2600 are again illustrated as running along a predetermined location within the nozzle body. In order to reduce the relative distance between the gas manifold 2600 and gas orifices of the nozzle, it may be preferable to form the gas manifold relatively closer to the bottom surface of the nozzle. When the dispense manifolds 2605, 2610 and 2615 are arranged in a relatively triangular configuration as illustrated in this diagram, it may be further preferable to form the gas manifold 2600 along a relatively outer or edge region of the nozzle. It shall be understood however that the positioning of the gas manifolds may be altered depending upon how many there are and the total number of dispense manifolds selected within the nozzle body in accordance with other embodiments of the invention.

Figure 31:
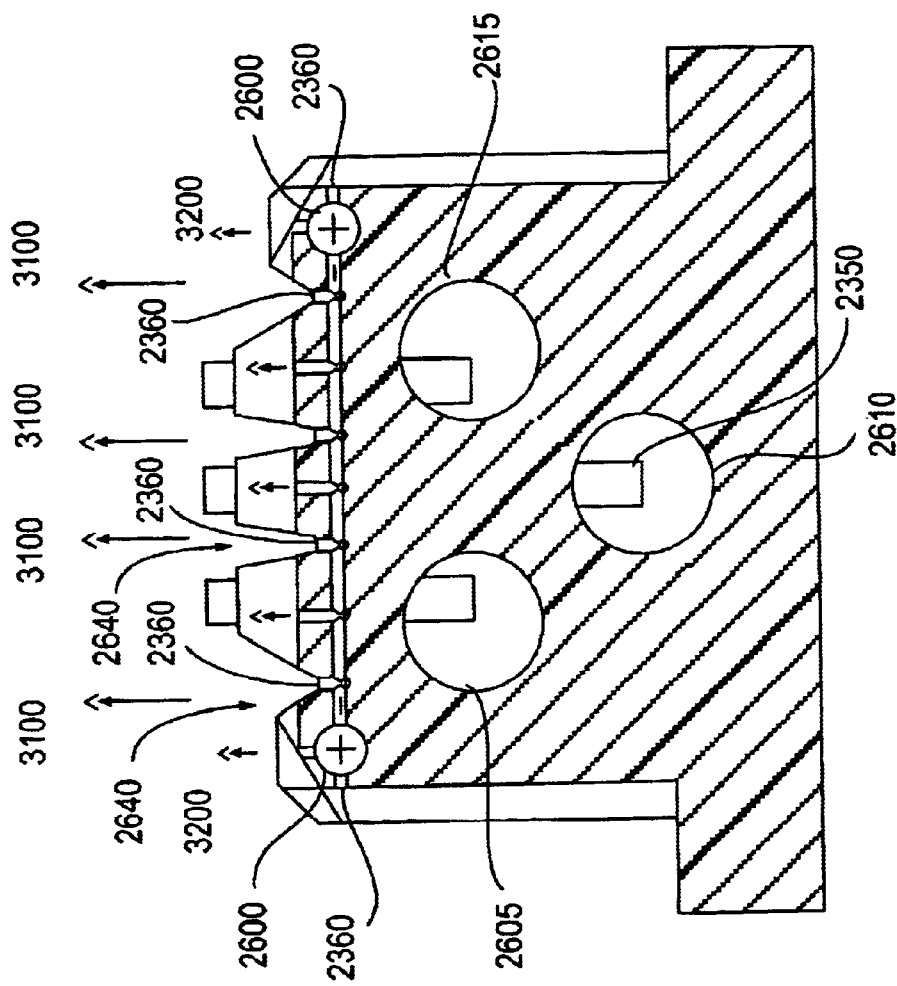

FIG. 31 provides another cross-sectional view of the nozzle 2300 shown in FIG. 23 taken along longitudinal line E—E. From this illustration, several aspects of the invention are depicted. For example, the plurality of longitudinal manifolds 2605, 2610 and 2615 are illustrated which include multiple nozzle inserts 2350 formed of various lengths to dispense fluids in relatively parallel streams. Moreover, the series of trenches 2640 are also illustrated with separate rows of nozzle inserts 2350 to space them apart and to channel laterally dispersed fluids ejected from the nozzle. Gas emanating from the network of nozzle orifices 2360 may thereafter create a layer of gas to push back such liquid and splashback from a wafer substrate surface. The pressurized gas may be routed and delivered through the gas manifolds 2600 which may consist of a lattice network of channels formed between some or all of the nozzle inserts 2350. The gas manifold may lead to one or more gas orifices located within relatively deeper portions of the nozzle trenches to create rows of pressured gas to generate relatively longitudinal blankets of gas 3100 to reduce cross-contamination. In addition, the gas manifold may lead to relatively shallower portions of the nozzle trenches to create columns of pressurized gas to further generate additional blankets of gas 3200 along cross-sections of the nozzle.

Figure 32:
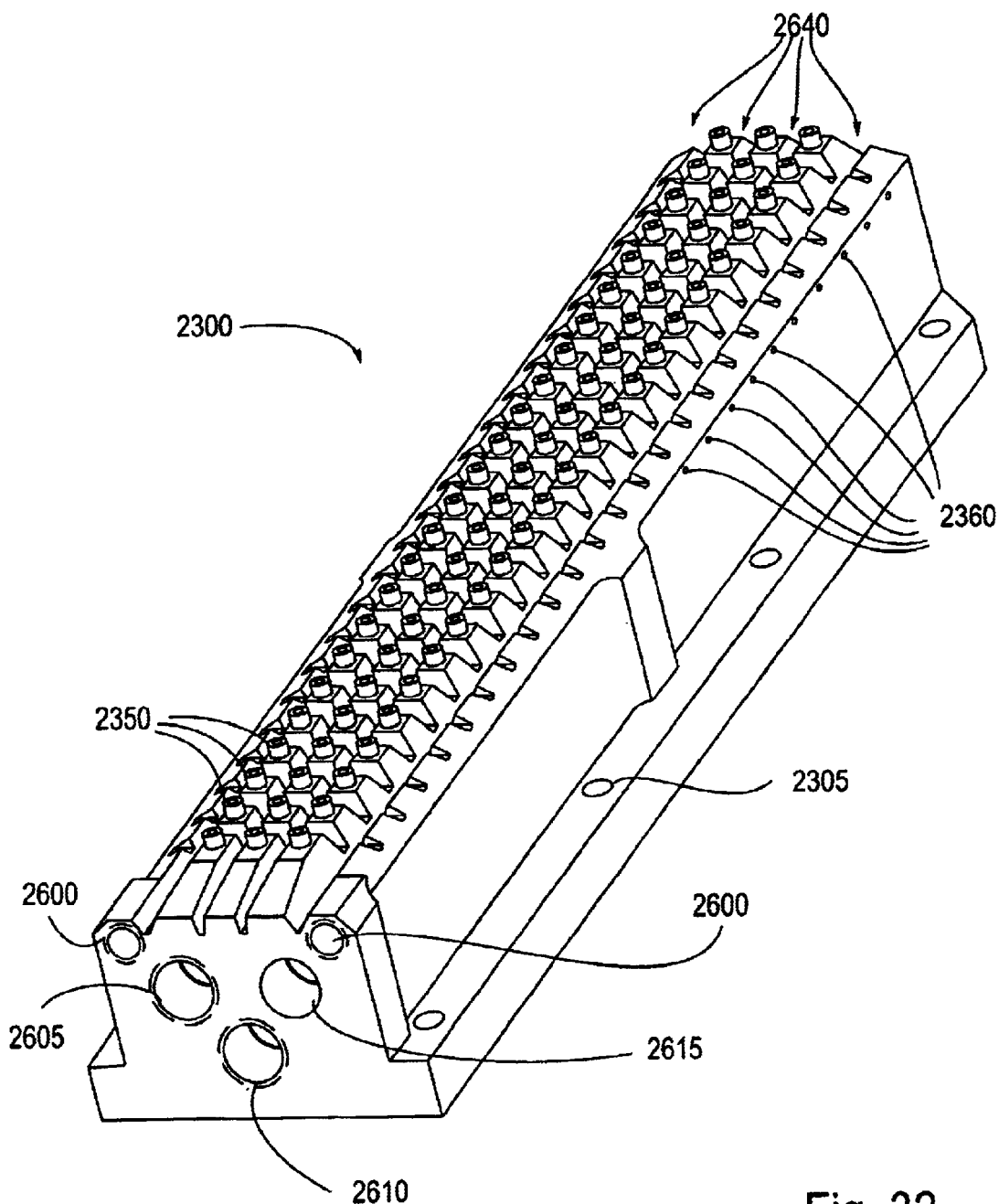
FIG. 32 is a perspective view of the nozzle shown in FIG. 23.

FIG. 32 provides an overall perspective view of the multi-port nozzle 2300. The plurality of gas manifolds 2300 and dispensed liquid manifolds 2605, 2610 and 2615 are illustrated again with further clarity. Each of the nozzle inserts 2350 are positioned within the nozzle body so that a selected portion thereof extends beyond the external surface of the nozzle 2300. A series of trenches 2640 are formed along the rows and columns of nozzle inserts 2300 to provide additional physical separation between the liquid dispensed therefrom. As with other embodiments of the invention, the total number of nozzle inserts and their spacing may vary according to selected applications. Additionally a plurality of gas orifices as described herein are formed along the outer surface of the nozzle 2300 including regions within the trenches in between the nozzle inserts. A number of openings 2305 are also formed along the outer edge region of the nozzle 2300 for which fasteners can pass through to connect the nozzle to a robot arm within a wafer track system subsystem such as a develop fluid module.

All of the nozzles provided in accordance with this invention may be mounted onto a robot arm within a wafer track tool. As illustrated in FIG. 33 (not drawn to scale), the nozzle 3300 may be fastened onto a support bracket 3303 for suspension over a wafer substrate 3320. The support bracket 3303 may in turn be mounted onto a robot arm 3330 that is rotatably mounted onto a post 3340. The nozzle 3300 may thus be moved over various portions of the wafer 3320 so that certain dispensed fluids may be released through selected portions of the nozzle over a relatively central region of the wafer substrate. At the same time, the support bracket may be adjustable along a relatively Z-axis to control the distance between the nozzle and underlying wafer 3320. The support bracket 3303 may further include a collar portion 3350 surrounding the various inlets formed along the top surface of the nozzle 3300 as described herein. It shall be understood that the collar 3350 portion and other portions of the support bracket may be constructed from multiple components or formed as a unitary body. The collar 3350 may be also connected to a cooling jacket 3360 which circulates a liquid medium to provide heat transfer and temperature control of liquid traveling through a plurality of liquid dispense lines 3305, 3310 and 3315 contained therein. Portions of the liquid cooling jacket 3360 may be positioned within a hollow portion of the robot arm 3330 as illustrated. The liquid dispense lines may be further connected to respective inlets formed in the nozzle to receive various liquid materials such as develop fluid and deionized water. Alternatively, the lines may be fed through another series of channels within the support bracket which in turn lead to the nozzle inlets. An external gas source may be fed into a passageway formed in the support bracket which in turn may lead into the gas manifold within the nozzle. Alternatively, the gas inlet may be fed directly into the gas manifold of the nozzle (not shown) as described in other figures and description herein.

Additional embodiments of the invention include a nozzle bank formed of a nozzle halved into two adjacent sections wherein each section may extend from a central region over the wafer substrate toward its periphery. Each half-section nozzle may dispense at least one liquid and may or may not include a gas curtain as described herein. In such embodiments, the angle which may be formed between the two sections may range from 0 to 360 degrees. As with other embodiments of the invention, the relative distance between nozzle and wafer substrate may be adjustable, and the nozzle bank may be mounted relatively stationary to a robot arm on which it is mounted or it may be rotatably mounted.

A variety of semiconductor wafer processing methods may be completed with the apparatus herein in accordance with another aspect of the invention. With respect to a typical method provided herein, a selected liquid-dispensing nozzle is brought to a height of approximately 15 mm above the wafer substrate and the gas flow rate is set to about 20 cc/sec. when liquid is dispensed. First, the wafer surface is wetted by deionized water (DI) for 0–10 sec while spinning between 0–2000 rpm. Then, after a delay of 0–5 sec, develop dispense may begin @ 0–1000 rpm for 0–5 sec. The objective here is to have full coverage over the wafer surface without any de-wetting taking place. Then, a developer fluid puddle is formed. The develop process continues for 2–100 sec while the wafer is either at rest or oscillating. Following this procedure, the DI dispense starts while spinning between 0–2000 rpm for 0–100 sec to rinse the dissolved resist effectively without causing precipitates and splashbacks. Finally, the wafers are dried at 1000–3000 rpm for 5–30 sec. It shall be understood that other dispense and rinse methodologies may be implemented with the apparatus and methods provided herein.

While the invention has been described with reference to the aforementioned specification, the descriptions and illustrations of the preferable embodiments herein are not meant to be construed in a limiting sense. It shall be understood that all aspects of the invention are not limited to the specific depictions, configurations or relative proportions set forth herein which depend upon a variety of conditions and variables. Various modifications in form and detail of the embodiments of the invention, as well as other variations of the invention, will be apparent to a person skilled in the art upon reference to the present disclosure. It is therefore contemplated that the appended claims shall also cover any such modifications, variations or equivalents.

What is claimed is:

1. A multi-port nozzle for dispensing fluids in a develop fluid module comprising:
   a nozzle body formed with at least one liquid manifold in fluid communication with at least one fluid inlet, and at least one gas manifold in fluid communication with at least one gas inlet; and
   a plurality of tubular nozzle inserts for dispensing fluids that are positioned within the nozzle body, wherein at least a portion of each nozzle insert extends therefrom, and wherein each nozzle insert is in fluid communication with the liquid manifold to permit the passage of dispensed fluids therethrough;
   wherein the nozzle body includes a network of gas orifices in fluid communication with the gas manifold that are formed substantially adjacent to selected nozzle inserts to thereby provide blankets of gas for mitigating cross-contamination of dispensed fluids released from the nozzle inserts.

2. The multi-port nozzle as recited in claim 1, wherein the nozzle body is formed with a first liquid manifold that is in fluid communication with a first fluid inlet, and a second liquid manifold that is in fluid communication with a second fluid inlet.

3. The multi-port nozzle as recited in claim 2, wherein the first fluid inlet and the second fluid inlet are formed on a top surface of the nozzle body.

4. The multi-port nozzle as recited in claim 3, wherein the first and second fluid inlets are formed within a relatively central region on the top surface of the nozzle body.

5. The multi-port nozzle as recited in claim 1, wherein the first fluid inlet is connected to a first developer fluid source for dispensing the first developer fluid over a wafer substrate within the develop fluid module, and wherein the second fluid inlet is connected to a second developer fluid source for dispensing the second developer fluid over the wafer substrate.

6. The multi-port nozzle as recited in claim 1, wherein the network of gas orifices form a grid pattern arrangement on an external surface of the nozzle body, and wherein the nozzle inserts are located within the grid pattern such that gas emanating from the gas orifices form substantially parallel blankets of gas for reducing cross-contamination of dispensed fluids.

7. The multi-port nozzle as recited in claim 6, wherein the external surface defines a bottom surface of the nozzle body to be positioned over a wafer substrate within the develop fluid module.

8. The multi-port nozzle as recited in claim 1, wherein the nozzle body is formed with an end surface, and wherein a pair of developer fluid inlets are formed thereon to facilitate delivery of developer fluid into a corresponding pair of liquid manifolds for dispensing the developer fluid through a selected first group of nozzle inserts onto a wafer substrate, and wherein a rinse fluid inlet is also formed thereon to facilitate delivery of a rinse fluid into a corresponding liquid manifold for dispensing a rinse fluid through a selected second group of nozzle inserts onto the wafer substrate.

9. A nozzle for dispensing develop fluid and deionized water comprising:
   a nozzle body formed with a plurality of manifolds within the nozzle body wherein each is in fluid communication with a separate fluid inlet formed along a top surface of the nozzle body; and
   a plurality of tubular nozzle extensions formed along a bottom surface of the nozzle body which are in fluid communication with at least one manifold,
   wherein the nozzle body includes a grid network of trenches formed along a selected region of the bottom surface of the nozzle body and in between a predetermined group of nozzle extensions to channel laterally moving fluids released from the nozzle extensions.

10. The nozzle as recited in claim 9, wherein the nozzle body and the plurality of tubular nozzle extension are formed from a single-piece construction.

11. The nozzle as recited in claim 9, wherein the grid network of trenches include relatively deeper trenches formed along a first predefined portion of the bottom surface of the nozzle body, and relatively shallower trenches formed along a second predefined portion of the bottom surface.

12. A dispense nozzle for delivering multiple processing fluids onto a semiconductor wafer substrate comprising:
   a nozzle body formed with plurality of longitudinal liquid manifolds and gas manifolds, wherein each liquid manifold is positioned within the nozzle body and in fluid communication with a separate corresponding fluid inlet formed in the nozzle body for receiving processing fluids to be dispensed; and
   a plurality of nozzle tips for directing dispensed liquids that are positioned within the nozzle body, and wherein at least a portion of each tip extends beyond a bottom surface of the nozzle body and into at least a portion of a liquid manifold within the nozzle body;
   wherein the bottom surface includes a network of trenches formed in between the plurality of nozzle tips in a grid pattern, and wherein the network of trenches further includes a plurality of gas orifices in fluid communication with the gas manifold to create streams of gas which direct multiple processing fluids onto the semiconductor wafer substrate with reduced cross-contamination and splashback from the wafer substrate.

13. The dispense nozzle as recited in claim 12, wherein the nozzle tips are separately formed inserts positioned within preformed openings within the nozzle body.

14. The dispense nozzle as recited in claim 12, wherein the nozzle tips are formed from a material that allows thermal contraction of the tips upon exposure to a relatively cold temperature for positioning within a nozzle body, and thermal expansion of the tips upon exposure to a relatively warmer temperature thereafter providing a substantially fluid tight fit.

15. The dispense nozzle as recited in claim 12, wherein the nozzle body includes two developer manifolds for dispensing developer fluids which are formed relatively closer to the bottom surface of the nozzle body, and a rinse manifold for dispensing a rinse fluid which is formed relatively further from the bottom surface of the nozzle body.

16. The dispense nozzle as recited in claim 15, wherein the nozzle tips include: a group of relatively short tips for dispensing the developer fluids from the two developer manifolds that are formed relatively closer to the bottom surface of the nozzle body; and a group of relatively long tips for dispensing the rinse fluid from the rinse manifold that is formed relatively further from the bottom surface of the nozzle body.

* * * * *